United States Patent
Ohki

(10) Patent No.: US 8,772,130 B2
(45) Date of Patent: Jul. 8, 2014

(54) MANUFACTURING METHOD OF SOI SUBSTRATE

(75) Inventor: Hiroshi Ohki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/589,704

(22) Filed: Aug. 20, 2012

(65) Prior Publication Data

US 2013/0052799 A1  Feb. 28, 2013

(30) Foreign Application Priority Data

Aug. 23, 2011  (JP) ................................. 2011-181744

(51) Int. Cl.
*H01L 21/762* (2006.01)

(52) U.S. Cl.
USPC .................. 438/458; 257/E21.568; 438/400; 438/455; 438/506; 438/513; 438/527; 438/798

(58) Field of Classification Search
USPC .......... 257/E21.568; 438/400, 455, 458, 506, 438/513, 527, 798
See application file for complete search history.

(56) References Cited

U.S. PATENT DOCUMENTS

| | | | |
|---|---|---|---|
| 5,528,032 A | 6/1996 | Uchiyama | |
| 6,372,609 B1 | 4/2002 | Aga et al. | |
| 6,995,075 B1 * | 2/2006 | Usenko | 438/458 |
| 7,851,318 B2 | 12/2010 | Koyama et al. | |
| 8,049,253 B2 | 11/2011 | Isobe | |
| 8,067,793 B2 | 11/2011 | Akimoto | |
| 8,143,134 B2 | 3/2012 | Shichi et al. | |
| 2002/0064924 A1 * | 5/2002 | Cheung et al. | 438/400 |
| 2008/0308911 A1 | 12/2008 | Okamoto | |
| 2010/0291754 A1 | 11/2010 | Koyama et al. | |
| 2011/0183494 A1 | 7/2011 | Koezuka et al. | |
| 2012/0018808 A1 | 1/2012 | Isobe | |
| 2012/0058612 A1 | 3/2012 | Akimoto | |
| 2012/0164817 A1 | 6/2012 | Shichi et al. | |

FOREIGN PATENT DOCUMENTS

| | | |
|---|---|---|
| JP | 06-275697 A | 9/1994 |
| JP | 2000-124092 | 4/2000 |

* cited by examiner

*Primary Examiner* — Asok K Sarkar
(74) *Attorney, Agent, or Firm* — Eric J. Robinson; Robinson Intellectual Property Law Office, P.C.

(57) ABSTRACT

In order to keep the crystallinity of the semiconductor thin film layer high, a temperature of a semiconductor substrate during hydrogen ion addition treatment is suppressed to lower than or equal to 200° C. In addition, the semiconductor substrate is subjected to plasma treatment while the semiconductor substrate is kept at a temperature of higher than or equal to 100° C. and lower than or equal to 400° C. after the hydrogen ion addition treatment, whereby Si—H bonds which have low contribution to separation of the semiconductor thin film layer can be reduced while Si—H bonds which have high contribution to separation of the semiconductor thin film layer, which are generated by the hydrogen ion addition treatment, are kept.

15 Claims, 18 Drawing Sheets

MANUFACTURING METHOD OF SOI SUBSTRATE

BACKGROUND OF THE INVENTION

1. Field of the Invention

The present invention relates to a manufacturing method of an SOI substrate.

2. Description of the Related Art

Instead of a silicon wafer which is manufactured by thinly slicing an ingot of a single crystal silicon, a substrate in which a thin semiconductor layer is provided on an insulating surface (hereinafter also referred to as an SOI substrate; the term "SOI substrate" is generally used as an abbreviation of "Silicon on Insulator"; however, in this specification, it is not necessary to limit a semiconductor film formed on an insulating surface to a silicon film and therefore the term "SOI substrate" is used as an abbreviation of "Semiconductor on Insulator") is manufactured and is used for manufacturing semiconductor integrated circuit elements or the like.

As a method for manufacturing an SOI substrate, a method in which hydrogen ions are added to a semiconductor substrate is known (for example, see Patent Document 1). In the method, first, an insulating layer (e.g., a thermal oxide film) is formed on a surface of a semiconductor substrate (e.g., a single crystal silicon substrate), and hydrogen ions are added to the semiconductor substrate through the surface where the insulating layer is formed, so that a dangling bond is terminated by added hydrogen ions and a microbubble region (in this specification, also referred to as an embrittlement region) is formed at a predetermined depth which is the neighborhood of the surface. Next, a different substrate (e.g., a glass substrate, a silicon wafer) is bonded to the surface side of the semiconductor substrate where the microbubble region is formed, and heat treatment is performed. Consequently, hydrogen ions in the semiconductor substrate are gathered in the micro-bubble region and a cleavage phenomenon occurs in the micro-bubble region, so that a semiconductor thin film layer separated from the semiconductor substrate and the insulating layer formed in contact with the semiconductor thin film layer can be transferred to the different substrate.

REFERENCE

[Patent Document 1] Japanese Published Patent Application No. 2000-124092

SUMMARY OF THE INVENTION

With an SOI substrate manufactured by the above method, for example, the semiconductor thin film layer is processed, so that a semiconductor element such as a transistor is formed; therefore, the semiconductor thin film layer is required to have little unevenness (hereinafter also referred to as the maximum peak-to-valley height or P-V value) on its surface (that is, the surface opposite to the surface in contact with the insulating layer) and high crystallinity.

The surface condition of the semiconductor thin film layer separated from the semiconductor substrate greatly depends on a temperature of the semiconductor substrate during the hydrogen ion addition treatment. For example, a semiconductor substrate is increased to approximately 260° C. during the hydrogen ion addition treatment (hereinafter referred to as Condition A) and another semiconductor substrate is kept at a temperature of approximately 120° C. during the hydrogen ion addition treatment (hereinafter referred to as Condition B). FIG. 9 shows results of evaluation of Si—H bonds in the vicinity of the embrittlement region of each of the semiconductor substrates under the conditions using Fourier transform infrared spectroscopy (FT-IR).

The FT-IR spectrum shows distribution of the kind of defects such as a Si—H bond of a hydrogen atom and a dangling bond of Si around and due to the vacancy which is formed by the hydrogen ion addition treatment or a Si—H bond of a hydrogen atom and Si between lattices.

Note that in Condition A and Condition B, the acceleration voltage and the dose of hydrogen ions are the same and a thermal oxide film is formed on the surface of the semiconductor substrate used. In FIG. 9, the horizontal axis indicates wavenumber of infrared ray ($cm^{-1}$) and the vertical axis indicates absorbance (arbitrary unit).

As shown in FIG. 9, in the semiconductor substrate of Condition A, peaks at around 2100 $cm^{-1}$ and at around 2155 $cm^{-1}$ can be confirmed. The peak at 2100 $cm^{-1}$ is caused by a bond (Si (100):H in FIG. 9) of a hydrogen atom and a dangling bond of Si of an embrittlement region (also referred to as a platelet defect) in a Si (100) plane. It can be said that this is a defect needed for separating the semiconductor thin film layer from the semiconductor substrate. Further, the peak at 2155 $cm^{-1}$ is caused by a Si—H bond (VH3 in FIG. 9) where three hydrogen atoms are respectively bonded to three dangling bonds of Si around and due to the vacancy which is formed by the hydrogen ion addition treatment. It can be said that this is also a defect needed for separating the semiconductor thin film layer from the semiconductor substrate because a supply source which supplies hydrogen molecules to the platelet defect by heat treatment is caused by the state of the hydrogen ions in silicon, which is confirmed from the peaks at around 2100 $cm^{-1}$ and at around 2155 $cm^{-1}$.

Further, in the semiconductor substrate of Condition B, in addition to the peaks confirmed in Condition A, peaks of a variety of Si—H bonds are confirmed. For example, the peak at 1980 $cm^{-1}$ is a peak caused by a Si—H bond where silicon moved to a space between lattices (interstitial Si) is bonded to two hydrogen atoms (IH2 in FIG. 9), the peak at 2065 $cm^{-1}$ is a peak caused by a Si—H bond where one hydrogen atom is bonded to a dangling bond of Si around a vacancy (VH in FIG. 9), and the peak at 1930 $cm^{-1}$ is a peak caused by Si—H bonds where plural hydrogen atoms are bonded to dangling bonds of Si around two vacancies, which are Si—H bonds which have lower contribution to separation of the semiconductor thin film layer as compared to the Si—H bonds having peaks at 2100 $cm^{-1}$ or at 2155 $cm^{-1}$ described above.

As shown in Condition B, in the case where a temperature of the semiconductor substrate is low during the hydrogen ion addition treatment, various defects which are eliminated in the case where a temperature of the semiconductor substrate is high might remain in the semiconductor substrate. Therefore, when the semiconductor thin film layer is separated from the semiconductor substrate, not only a platelet defect in a Si (100) plane but also the above defective portions dispersed in the semiconductor substrate may be an interface for separation and thus relatively large unevenness is likely to be formed on the surface of the semiconductor thin film layer separated.

That is, in order to decrease P-V value of the surface of the semiconductor thin film layer, it can be said that it is effective to increase a temperature of the semiconductor substrate during the hydrogen ion addition treatment.

However, as a temperature of the semiconductor substrate during the hydrogen ion addition treatment is higher, a crystal defect or dislocation of a crystal structure occurs more easily and thus the crystallinity of the semiconductor thin film layer may become worse.

Therefore, in the method for manufacturing an SOI substrate by adding hydrogen ions to the semiconductor substrate, it can be said that it is hard to obtain a semiconductor thin film layer having small P-V value of its surface and high crystallinity.

In view of the above problems, in this specification, an object of one embodiment of the present invention is to provide a manufacturing method of an SOI substrate provided with a semiconductor thin film layer having small P-V value of its surface and high crystallinity.

In order to keep the crystallinity of the semiconductor thin film layer high, a temperature of a semiconductor substrate during hydrogen ion addition treatment is suppressed to lower than or equal to 200° C. In addition, the semiconductor substrate is subjected to plasma treatment while the semiconductor substrate is kept at a temperature of higher than or equal to 100° C. and lower than or equal to 400° C. after the hydrogen ion addition treatment, whereby Si—H bonds which have low contribution to separation of the semiconductor thin film layer can be reduced while Si—H bonds which have high contribution to separation of the semiconductor thin film layer, which are generated by the hydrogen ion addition treatment, are kept.

That is, one embodiment of the present invention is a method for manufacturing an SOI substrate, in which an insulating layer is formed on a surface of a semiconductor substrate; an embrittlement region is formed in the semiconductor substrate by adding accelerated ions to the semiconductor substrate; plasma treatment is performed on the semiconductor substrate through the insulating layer; a base substrate is bonded to the semiconductor substrate; heat treatment is performed on the semiconductor substrate; and a semiconductor thin film layer is formed over the base substrate with the insulating layer interposed therebetween by separating the base substrate from the semiconductor substrate with the embrittlement region used as an interface. Further, in the above method, the semiconductor substrate is kept at a temperature of lower than or equal to 200° C. during the addition of the ions, and the semiconductor substrate is kept at a temperature of higher than or equal to 100° C. and lower than or equal to 400° C. during the plasma treatment.

By an application of the above manufacturing method of an SOI substrate, an SOI substrate provided with a semiconductor thin film layer having small P-V value of its surface and high crystallinity can be manufactured.

Further, one embodiment of the present invention is a method for manufacturing an SOI substrate, in which an insulating layer is formed on a surface of a semiconductor substrate; an embrittlement region is formed in the semiconductor substrate by adding accelerated ions to the semiconductor substrate; plasma treatment is performed on the semiconductor substrate; a base substrate is bonded to the semiconductor substrate with the insulating layer interposed therebetween; heat treatment is performed on the semiconductor substrate; and a semiconductor thin film layer is formed over the base substrate with the insulating layer interposed therebetween by separating the base substrate from the semiconductor substrate with the embrittlement region used as an interface. Further, in the above method, the semiconductor substrate is kept at a temperature of lower than or equal to 200° C. during the addition of the ions. Furthermore, in the above method, the plasma treatment is performed so that when distribution of Si—H bonds in the semiconductor substrate is measured by Fourier transform infrared spectroscopy, peaks of absorbance in a range greater than or equal to 1930 $cm^{-1}$ and less than or equal to 2065 $cm^{-1}$ in the semiconductor substrate after the plasma treatment are reduced from peaks of absorbance in the range in the semiconductor substrate before the plasma treatment, and peaks of absorbance at 2110 $cm^{-1}$ and at 2155 $cm^{-1}$ in the semiconductor substrate after the plasma treatment are greater than or equal to 80% of peaks of absorbance at 2110 $cm^{-1}$ and at 2155 $cm^{-1}$ in the semiconductor substrate before the plasma treatment.

By an application of the above manufacturing method of an SOI substrate, an SOI substrate provided with a semiconductor thin film layer having small P-V value and high crystallinity can be manufactured.

Further, in the above manufacturing method of an SOI substrate, the ions are added to the semiconductor substrate plural times; whereby an increase in a temperature of the semiconductor substrate can be effectively suppressed during the ion addition treatment and thus an SOI substrate provided with a semiconductor thin film layer having higher crystallinity can be manufactured.

Further, in the above manufacturing method of an SOI substrate, the plasma treatment is performed for longer than or equal to 10 minutes, whereby Si—H bonds which have low contribution to separation of the semiconductor thin film layer can be effectively reduced and thus an SOI substrate provided with a semiconductor thin film layer having smaller P-V value can be manufactured.

Further, in the above manufacturing method of an SOI substrate, any one of aluminosilicate glass, aluminoborosilicate glass, barium borosilicate glass, and quartz substrate is used for the base substrate, whereby a manufacturing cost of semiconductor devices using the SOI substrate can be reduced.

A temperature of a semiconductor substrate during hydrogen ion addition treatment is suppressed to lower than or equal to 200° C., whereby crystallinity of a semiconductor thin film layer of an SOI substrate manufactured using the semiconductor substrate can be kept high. In addition, the semiconductor substrate is subjected to plasma treatment while the semiconductor substrate is kept at a temperature of higher than or equal to 100° C. and lower than or equal to 400° C. after the hydrogen ion addition treatment, whereby Si—H bonds which have low contribution to separation of the semiconductor thin film layer of Si—H bonds generated in the semiconductor substrate during the hydrogen ion addition treatment can be significantly reduced. Accordingly, the semiconductor thin film layer to be separated from the semiconductor substrate has high crystallinity and small P-V value; therefore, an SOI substrate can be manufactured which includes the semiconductor thin film layer having small P-V value and high crystallinity, which can withstand the formation of a semiconductor integrated circuit having high performance.

DETAILED DESCRIPTION OF THE INVENTION

Figure 1A:
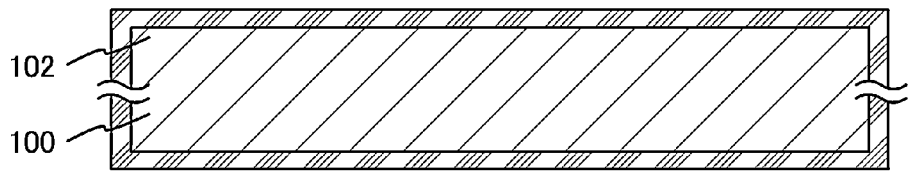
FIGS. 1A to 1D illustrate a method for manufacturing an SOI substrate.

Embodiments and an example of the present invention will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structure of the present invention described below, portions that are identical or portions having similar functions in different drawings are denoted by the same reference numerals, and their repetitive description will be omitted.

(Embodiment 1)

In this embodiment, a manufacturing method of an SOI substrate including a semiconductor thin film layer with high crystallinity and planarity will be described.

First, a semiconductor substrate 100 is prepared, and an insulating layer 102 is formed on a surface of the semiconductor substrate 100 (see FIG. 1A). As the semiconductor substrate 100, for example, a single crystal semiconductor substrate that is formed of an element belonging to Group 14, such as a single crystal silicon substrate, a single crystal germanium substrate, or a single crystal silicon germanium substrate, can be used. Alternatively, a compound semiconductor substrate formed using silicon carbide, gallium arsenide, indium phosphide, or the like can be used. A commercially-available silicon substrate is typically a circular substrate having a size of 5 inches (125 mm) in diameter, 6 inches (150 mm) in diameter, 8 inches (100 mm) in diameter, 12 inches (300 mm) in diameter, and 16 inches (400 mm) in diameter. Note that the shape of the semiconductor substrate 100 is not limited to a circular shape, and the semiconductor substrate 100 may be a substrate that is processed into a rectangular shape or the like, for example. Further, the semiconductor substrate 100 can be manufactured by the Czochralski (CZ) method or the floating zone (FZ) method.

The insulating layer 102 can be formed with a single layer or a stacked layer using, for example, a silicon oxide film, a silicon nitride film, a silicon oxynitride film, a silicon nitride oxide film, an aluminum oxide film, an aluminum nitride film, an aluminum oxynitride film, an aluminum nitride oxide film, and/or the like. As a manufacturing method of the insulating layer 102, a thermal oxidation method, a CVD method, a sputtering method, or the like can be used. Here, oxynitride refers to a material containing more oxygen than nitrogen, and nitride oxide refers to a material containing more nitrogen than oxygen.

When the insulating layer 102 is formed by a CVD method, a silicon oxide film is preferably formed using organosilane such as tetraethoxysilane (abbreviation: TEOS, chemical formula: $Si(OC_2H_5)_4$), to obtain favorable bonding.

Note that in the case where the insulating layer 102 is formed by a thermal oxidation method, the thermal oxidation treatment is preferably performed in an oxidizing atmosphere to which halogen is added.

For example, by performing thermal oxidation treatment on the semiconductor substrate 100 in an oxidizing atmosphere to which chlorine (Cl) is added, the insulating layer 102 is formed through chlorine oxidation. In this case, the insulating layer 102 is film containing chlorine atoms. By such chlorine oxidation, a heavy metal (such as Fe, Cr, Ni, Mo, or the like, for example) that is an extrinsic impurity is trapped and a chloride of the metal is formed, which is then removed to the outside, thereby reducing contamination of the semiconductor substrate 100. Moreover, after it is bonded to a base substrate 200, an impurity such as Na from the base substrate is fixed, and contamination of the semiconductor substrate 100 can be prevented. Note that there is no particular limitation on the concentration of halogen added to the thermal oxide film; however, it is preferable that the concentration of the halogen atoms be higher than or equal to $1 \times 10^{16}$ atoms/$cm^3$ and lower than or equal to $1 \times 10^{22}$ atoms/$cm^3$.

As an example of the thermal oxidation treatment, thermal oxidation can be performed in an oxidizing atmosphere which contains hydrogen chloride (HCl) at a proportion of 0.5 volume % to 10 volume % (typically, 3 volume %) with respect to oxygen at a temperature of 900° C. to 1150° C. (typically, 1000° C.). The treatment time may be 0.1 hours to 6 hours, preferably 0.5 hours to 1 hour. There is no particular limitation on the thickness of the oxide film formed by the thermal oxidation treatment; for example, the oxide film preferably has a thickness of greater than or equal to 10 nm and less than or equal to 1000 nm.

Note that the halogen atoms contained in the insulating layer 102 are not limited to chlorine atoms. The insulating layer 102 may contain fluorine atoms. As a method of performing fluorine oxidation on the surface of the semiconductor substrate 100, there is a method in which the semiconductor substrate 100 is soaked in an HF solution and then subjected to a thermal oxidation treatment in an oxidizing atmosphere, a method in which the thermal oxidation treatment is performed in an oxidizing atmosphere to which $NF_3$ is added, or the like.

Further, it is preferable that the surface of the semiconductor substrate 100 be cleaned with hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before forming the insulating layer 102.

Figure 1B:
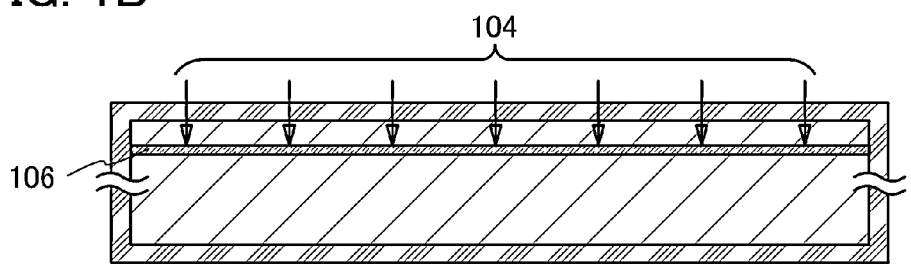

Then, ion addition treatment 104 is performed from a surface of the semiconductor substrate 100, so that an embrittlement region 106 is formed at a predetermined depth in the semiconductor substrate 100 (see FIG. 1B).

Note that the semiconductor substrate 100 is kept at a temperature of lower than or equal to 200° C. during the ion addition treatment 104 in this embodiment. As a method for keeping the semiconductor substrate 100 at a temperature of lower than or equal to 200° C., for example, the ion addition treatment 104 may be performed plural times so that the substrate temperature is lower than or equal to 200° C. just after each of the ion addition treatments 104. Note that the number of times of the ion addition treatment 104 changes depending on a material of the semiconductor substrate 100 or a condition of the ion addition treatment 104. Therefore, a change in temperature of the semiconductor substrate 100 due to the ion addition treatment is measured by a means capable of monitoring the change in temperature of the substrate (for example, a thermolabel), for example, and the number of times of the ion addition treatment 104 may be decided based on the measurement result.

The semiconductor substrate 100 is kept at a temperature of lower than or equal to 200° C. during the ion addition treatment 104, whereby a reduction in crystallinity of the semiconductor substrate 100 can be suppressed; therefore, crystallinity of a semiconductor thin film layer 110 separated from the semiconductor substrate 100 can be recovered to a state close to the crystallinity of the semiconductor substrate 100 by performing heat treatment in a later step. An effect of suppressing the reduction in crystallinity by keeping the semiconductor substrate 100 at a temperature of lower than or equal to 200° C. will be described in detail in Example 1 together with results of specific experiments.

Further, in order to suppress an increase in the temperature of the semiconductor substrate 100 due to the ion addition treatment 104, a structure in which a cooling medium is flown in a substrate mounting table for mounting the semiconductor substrate 100 or a heat dissipation structure (for example, a structure having unevenness on the surface opposite to the surface where the semiconductor substrate 100 is mounted may be employed. Needless to say, the structure and the ion addition treatment 104 performed plural times may be employed in combination, whereby the ion addition treatment 104 can be performed in a shorter time.

The ion addition treatment 104 can be performed with an ion doping apparatus or an ion implantation apparatus. With an ion implantation apparatus, ion species in plasma are subjected to mass separation, and only ion species having a certain mass can be added to a semiconductor substrate. Thus, an ion implantation apparatus is especially preferable.

Note that when the ion addition treatment is performed with the use of an ion doping apparatus, in the ion doping apparatus, mass separation of ion species in plasma is not performed; therefore, an element which does not need to be added (e.g., heavy metal) might be added at the same time. However, by performing the ion addition treatment through the insulating layer 102 containing halogen atoms, the heavy metal can be trapped in the insulating layer 102; therefore, contamination of the semiconductor substrate 100 by the heavy metal can be suppressed.

As for hydrogen ions added to the semiconductor substrate 100, the proportion of $H_3^+$ is preferably set high. Specifically, it is preferable that the proportion of $H_3^+$ be set higher than or equal to 50% (more preferably, higher than or equal to 80%) with respect to the total amount of $H^+$, $H_2^+$, and $H_3^+$. With a high proportion of $H_3^+$, the proportion of $H^+$ and $H_2^+$ included in the ion beam is lower relatively, which results in smaller variation in the average penetration depth due to a difference of the ion species. Consequently, the ion addition efficiency is improved and the ion addition time can be shortened.

The depth at which the embrittlement region 106 is formed can be adjusted by the kinetic energy, mass, charge, incidence angle, or the like of the hydrogen ions to be added. The embrittlement region 106 is formed at approximately the same depth as the average penetration depth of the ions. Thus, by adjusting the condition of the addition of the hydrogen ions, the thickness of the semiconductor thin film layer 110 to be separated from the semiconductor substrate 100 can be adjusted.

If the depth at which the embrittlement region 106 is formed is too shallow, the semiconductor thin film layer 110 is not separated well from the semiconductor substrate 100 and a hole might be formed in the semiconductor thin film layer 110. Further, if the depth at which the embrittlement region 106 is formed is too deep, the acceleration energy of the ion beam needs to be increased, which leads to a reduction in crystallinity of the semiconductor thin film layer 110 to be separated from the semiconductor substrate 100. Therefore, it is preferable that the average penetration depth of the ions to be added be adjusted so that the depth at which the embrittlement region 106 is formed is greater than or equal to 50 nm and less than or equal to 1000 nm, preferably greater than or equal to 50 nm and less than or equal to 300 nm.

For example, in the case where ion addition is performed using a hydrogen gas by ion doping, although depending on the ion species included in the ion beam, the proportion of the ion species, and the thickness of the insulating layer 102, it is preferable that acceleration voltage be set to higher than or equal to 10 kV and lower than or equal to 200 kV (preferably, higher than or equal to 30 kV and lower than or equal to 100 kV) and the dose (in the case that the ion implantation treatment is performed plural times, in total dose) is set to $1 \times 10^{16}$ ions/cm$^2$ to $6 \times 10^{16}$ ions/cm$^2$.

Note that heat treatment for restoring a crystal defect may be performed after the ion addition treatment 104. The temperature of this heat treatment is to be a temperature at which separation due to hydrogen concentration in the embrittlement region 106 does not occur. For example, this heat treatment may be performed at a temperature higher than or equal to 200° C. and lower than 400° C. The heat treatment can be performed using a diffusion furnace, a heating furnace such as a resistance heating furnace, a rapid thermal annealing (RTA) apparatus, a microwave heating apparatus, or the like. Note that the above-described temperature condition is just an example, a temperature may be adjusted as appropriate in accordance with materials to be used for the semiconductor substrate 100, and the present invention is not construed as being limited to the above range.

Figure 1C:
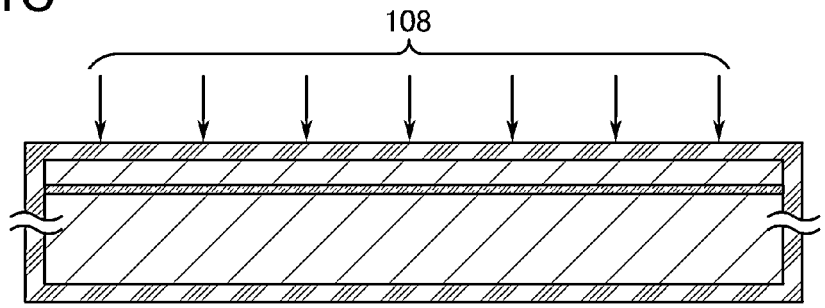

Next, the semiconductor substrate 100 is subjected to plasma treatment 108 while the semiconductor substrate 100 is kept at a temperature of higher than or equal to 100° C. and lower than or equal to 400° C. (see FIG. 1C).

The semiconductor substrate 100 may be kept at a temperature of higher than or equal to 100° C. and lower than or equal to 400° C. in such a manner that, for example, a substrate mounting table for mounting the semiconductor substrate 100 is heated and the heat of the substrate mounting table is transmitted to the semiconductor substrate 100. Alternatively, the method for suppressing an increase in the temperature of the semiconductor substrate 100, which has been described with reference to the above ion addition treatment 104, may be employed.

The plasma treatment 108 may be performed with the use of an inductively coupled plasma (ICP) method, a capacitively coupled plasma (CCP) method, a method using high-density plasma of microwaves (e.g., a frequency of 2.45 GHz), or the like, for longer than or equal to 10 minutes, preferably longer than or equal to 30 minutes. In addition, a rare gas having a large mass number, such as argon, krypton, or xenon, a hydrogen gas, or a mixed gas of the rare gas and a hydrogen gas is preferably used for the plasma treatment.

Further, as the plasma treatment 108, reverse sputtering in which an argon gas is introduced and plasma is generated can be performed. The reverse sputtering is a method in which voltage is applied to the substrate side with the use of an RF power source in the rare gas atmosphere, a hydrogen gas atmosphere, or a mixed gas atmosphere of the rare gas and a hydrogen gas and plasma is generated in the vicinity of the substrate. Note that instead of an argon atmosphere, a nitrogen atmosphere, a helium atmosphere, an oxygen atmosphere, or the like may be used.

Note that in a known manufacturing method of an SOI substrate, plasma treatment is performed before a base substrate is bonded to a semiconductor substrate. However, the plasma treatment is treatment for increasing the adhesion between the semiconductor substrate and the base substrate by removing residue on a surface of the semiconductor substrate and modifying condition of the surface of the semiconductor substrate. In contrast, the plasma treatment 108 in this embodiment is treatment mainly for obtaining the following effects.

In this embodiment, in order to suppress a reduction in crystallinity of the semiconductor thin film layer 110, the semiconductor substrate 100 is kept at a temperature of lower than or equal to 200° C. during the ion implantation treatment 104. Thus, a Si—H bond which has low contribution to separation of the semiconductor thin film layer 110 is inevitably generated in the semiconductor substrate 100. Therefore, the semiconductor substrate 100 is kept at a temperature of higher than or equal to 100° C. and lower than or equal to 400° C. and is subjected to the plasma treatment 108 as described above, whereby Si—H bonds which have low contribution to separation of the semiconductor thin film layer 110 are reduced in the semiconductor substrate 100 while Si—H bonds which have high contribution to separation of the semiconductor thin film layer 110 are kept in the semiconductor substrate 100.

Note that an effect of increasing the adhesion between the semiconductor substrate and the base substrate may be obtained in addition to the above effect.

Note that "Si—H bonds which have high contribution to separation of the semiconductor thin film layer 110 are kept in the semiconductor substrate 100" described above means the case where peaks of absorbance at 2100 $cm^{-1}$ and at 2155 $cm^{-1}$ of the semiconductor substrate 100 after the plasma treatment are higher than or equal to 80%, when peaks of absorbance at 2100 $cm^{-1}$ and at 2155 $cm^{-1}$ of the semiconductor substrate 100 before the plasma treatment are regarded as 100%.

Further, "Si—H bonds which have low contribution to separation of the semiconductor thin film layer 110" described above means bonds having peaks of absorbance in a range greater than or equal to 1930 $cm^{-1}$ and less than or equal to 2065 $cm^{-1}$ when Si—H bonds in the semiconductor substrate 100 are measured by Fourier transform infrared spectroscopy.

Figure 1D:
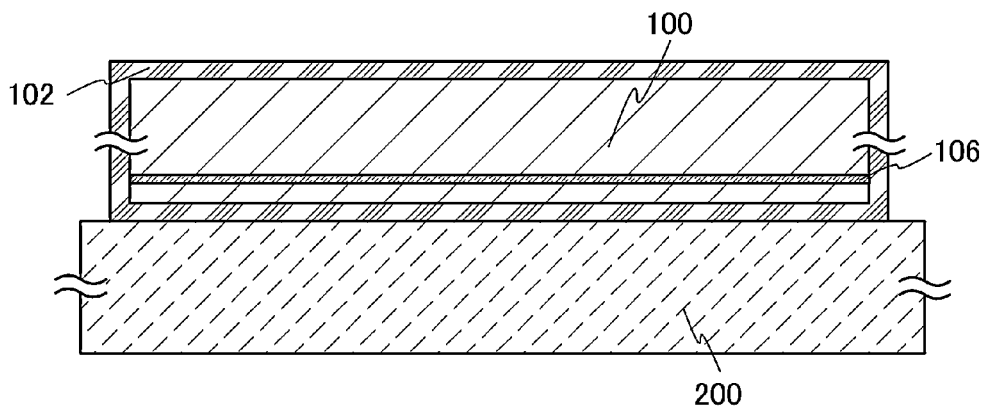

Next, a base substrate 200 is prepared, and the surface of the semiconductor substrate 100, in which the embrittlement region 106 is formed, is bonded to the base substrate 200 (see FIG. 1D). As the base substrate 200, a light-transmitting glass substrate which is used for a liquid crystal display device or the like can be used. As the glass substrate, the one whose strain point is higher than or equal to 600° C. is preferably used. For example, a variety of glass substrates used for electronic industries, such as an aluminosilicate glass substrate, an aluminoborosilicate glass substrate, or barium borosilicate glass substrate or a quartz substrate, can be given. In particular, when the above glass substrate is used as the base substrate 200, a manufacturing cost of a semiconductor device formed using an SOI substrate can be reduced because the base substrate 200 can be increased in size and glass substrates are inexpensive.

Further alternatively, a substrate which is formed using an insulator, such as a ceramic substrate or a sapphire substrate; a substrate which is formed using a conductor such as metal or stainless steel; or the like can be used as the base substrate 200. Note that any of the above substrates given as examples of the semiconductor substrate 100, or the like may be used.

Note that an insulating film may be formed over the base substrate 200. When an insulating film is formed over the base substrate 200, a method and a material which are similar to those of the insulating layer 102 can be used for the insulating film.

Further, a surface of the base substrate 200 is preferably cleaned in advance. Specifically, the base substrate 200 is subjected to ultrasonic cleaning using hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. By performing such a cleaning treatment, the planarity of the surface of the base substrate 200 can be improved and abrasive particles remaining on the surface of the base substrate 200 can be removed.

Further, before the semiconductor substrate 100 is bonded to the base substrate 200, surfaces to be bonded may be subjected to surface treatment. As the surface treatment, wet treatment, dry treatment, or a combination of wet treatment and dry treatment can be used. Alternatively, wet treatment may be used in combination with different wet treatment or dry treatment may be used in combination with different dry treatment. The surface treatment can improve the bonding strength at the interface between the semiconductor substrate 100 and the base substrate 200.

As examples of the wet treatment, ozone treatment using ozone water (treatment with ozone water), megasonic cleaning using an alkaline cleaner, brush cleaning, two-fluid cleaning (a method in which functional water such as pure water or hydrogenated water and a carrier gas such as nitrogen are sprayed together), and the like can be given. As examples of the dry treatment, irradiation with light from a Xe excimer UV lamp, plasma treatment, plasma treatment with bias application, and radical treatment can be given.

When bonding is performed, it is desirable to apply pressure of greater than or equal to 0.001 $N/cm^2$ and less than or equal to 100 $N/cm^2$, e.g., greater than or equal to 1 $N/cm^2$ and less than or equal to 20 $N/cm^2$, to a portion of the base substrate 200 or the semiconductor substrate 100. As described above, when the insulating layer 102 and the base substrate 200 are disposed in close contact with each other at one portion, from that portion where the close contact is made, the bonding of the insulating layer 102 and the base substrate 200 spontaneously spreads to almost the entire area of the substrate. This bonding is performed under the action of the Van der Waals force or hydrogen bonding and can be performed at room temperature.

Heat treatment may be performed after the bonding in order to increase the bonding strength between the semiconductor substrate 100 and the base substrate 200. This heat treatment is performed at a temperature at which separation at the embrittlement region 106 does not occur (for example, a temperature of higher than or equal to 200° C. and lower than 400° C.). Alternatively, the semiconductor substrate 100 and the base substrate 200 may be bonded to each other while being heated at a temperature in this temperature range. The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the present invention should not be construed as being limited to this example.

Figure 2:
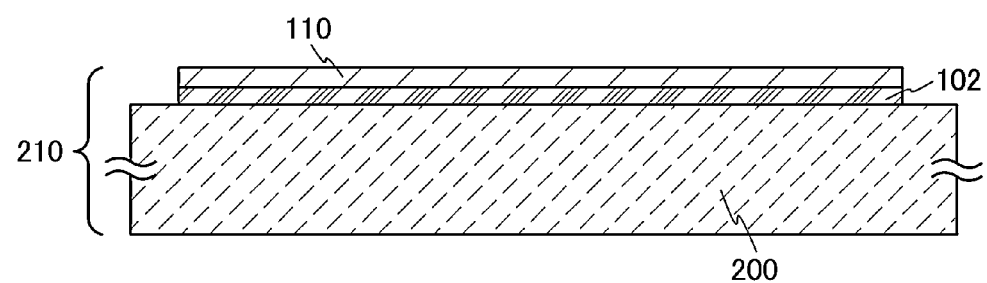
FIG. 2 illustrates a method for manufacturing an SOI substrate.

Next, the semiconductor substrate 100 is subjected to heat treatment. By performing the heat treatment, the hydrogen ions added to the semiconductor substrate 100 (or a gas containing the added hydrogen ions) by the ion addition treatment 104 are concentrated in the embrittlement region 106 and the pressure inside the semiconductor substrate 100 is increased with the embrittlement region 106 as a center. Then, a crack is generated in the embrittlement region 106, and accordingly, the semiconductor thin film layer 110 is separated from the semiconductor substrate 100 using the generated crack in the embrittlement region 106 as a boundary. After that, the semiconductor substrate 100 is separated from the base substrate 200, so that the semiconductor thin film layer 110 which is separated from the semiconductor substrate 100 is transferred over the base substrate 200 with the insulating layer 102 interposed therebetween (see FIG. 2).

Note that the heat treatment can be performed using a heating furnace such as a resistance heating furnace, a rapid thermal annealing (RTA) apparatus, a microwave heating apparatus, or the like. For example, in the case of using a heating furnace, the heat treatment may be performed at a temperature of higher than or equal to 550° C. and lower than the strain point of the base substrate 200 for longer than or equal to 0.5 hours and shorter than or equal to 6 hours.

Further, the heat treatment is not necessarily performed once and may be performed plural times. The heat treatment may be performed plural times while the temperature is changed in the following manner for example: after heat treatment at 200° C. is performed in a heating furnace for two hours, the temperature of the heating furnace is increased to 600° C. and then heat treatment at 600° C. is performed for two hours. The semiconductor substrate 100 is heated in advance at a temperature of lower than a temperature at which separation (cleavage) at the embrittlement region 106 occurs as described above, whereby the bonding strength between the semiconductor substrate 100 and the base substrate 200 can be further increased.

Note that after the semiconductor thin film layer 110 is separated from the semiconductor substrate 100, the semiconductor thin film layer 110 may be subjected to heat treatment at a temperature of higher than or equal to 100° C. to reduce the concentration of hydrogen that remains in the semiconductor thin film layer 110.

In an SOI substrate 210 manufactured through the above steps, the semiconductor thin film layer 110 has high crystallinity, and P-V value of the semiconductor thin film layer 110 can be decreased without performing planarization treatment such as polishing treatment using a CMP apparatus. Therefore, with the method described in this embodiment, an SOI substrate can be manufactured which includes the semiconductor thin film layer having small P-V value and high crystallinity, which can withstand the formation of a semiconductor integrated circuit having high performance.

(Embodiment 2)

In this embodiment, an example of a structure of a semiconductor device using an SOI substrate manufactured by the method described in Embodiment 1 is described with reference to FIGS. 3A to 3E and FIGS. 4A to 4D.

FIGS. 3A to 3E illustrate an example of a structure of a semiconductor device including an n-channel transistor and a p-channel transistor, which is manufactured using an SOI substrate manufactured by the method described in Embodiment 1. FIGS. 4A to 4D illustrate an example of a method for manufacturing the semiconductor device.

Figure 3A:
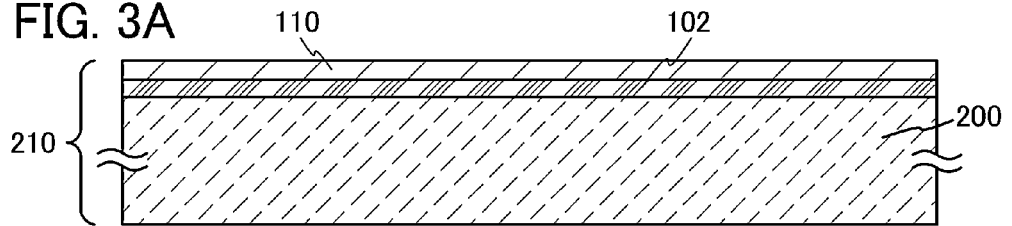
FIGS. 3A to 3E illustrate a semiconductor device.

FIG. 3A illustrates a cross-sectional view of an SOI substrate in which a semiconductor thin film layer 110 is provided over a base substrate 200 with an insulating layer 102 interposed therebetween. The SOI substrate has the same structure as that in FIG. 2 described in Embodiment 1.

Figure 3B:
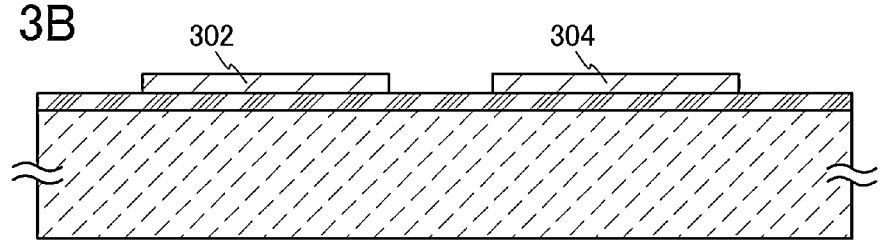

First, the semiconductor thin film layer 110 is separated into a plurality of semiconductor layers having an island shape (see FIG. 3B). The semiconductor thin film layer 110 is preferably separated using a photolithography method, for example. Note that structures and manufacturing methods of one n-channel transistor and one p-channel transistor are described in this embodiment; therefore, the semiconductor thin film layer 110 is separated into a semiconductor layer 302 (which forms a part of the n-channel transistor later) and a semiconductor layer 304 (which forms a part of the p-channel transistor later).

Figure 3C:
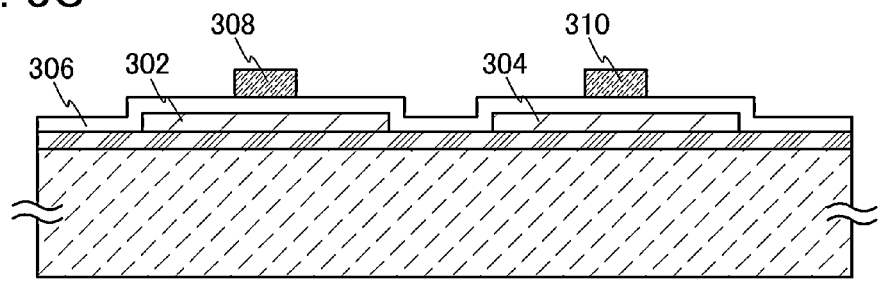

Next, after an insulating layer 306 is formed over the semiconductor layer 302 and the semiconductor layer 304, a gate electrode 308 is formed over the insulating layer 306 overlapping the semiconductor layer 302 and a gate electrode 310 is formed over the insulating layer 306 overlapping the semiconductor layer 304 (see FIG. 3C). Note that the insulating layer 306 serves as a gate insulating layer.

Before the semiconductor thin film layer 110 is etched, an impurity element imparting p-type conductivity such as boron, aluminum, or gallium or an impurity element imparting n-type conductivity such as phosphorus or arsenic is preferably added to the semiconductor thin film layer 110 in order to control the threshold voltage of transistors to be formed. For example, an impurity element imparting p-type conductivity is added to a formation region of an n-channel transistor, and an impurity element imparting n-type conductivity is added to a formation region of a p-channel transistor.

Figure 3D:
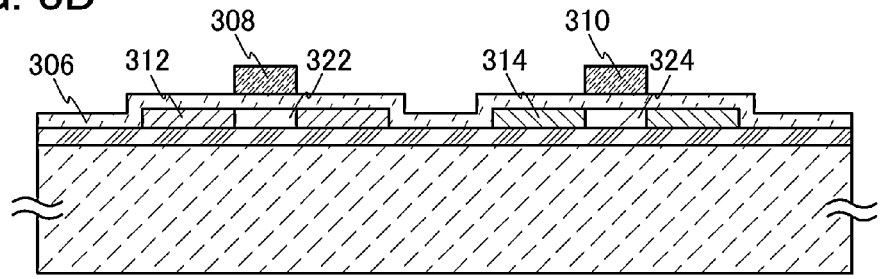

Next, an n-type impurity region 312 is formed in the semiconductor layer 302 and a p-type impurity region 314 is formed in the semiconductor layer 304 (see FIG. 3D).

The n-type impurity region 312 is formed by the following method for example: a resist mask is formed over the semiconductor layer 304 which constitutes part of a p-channel transistor and then an impurity element imparting n-type conductivity is added to the semiconductor layer 302 by an ion doping method or an ion implantation method. Thus, the impurity element is added to a region in the semiconductor layer 302, which does not overlap with the gate electrode 308, so that the n-type impurity region 312 is formed and a region overlapping with the gate electrode 308 becomes a channel formation region 322 in a self-aligned manner.

Then, after the resist covering the semiconductor layer 304 is removed, an impurity element imparting p-type conductivity is added to the semiconductor layer 304 by a method similar to the above to form a p-type impurity region 314 and a channel formation region 324.

Figure 3E:
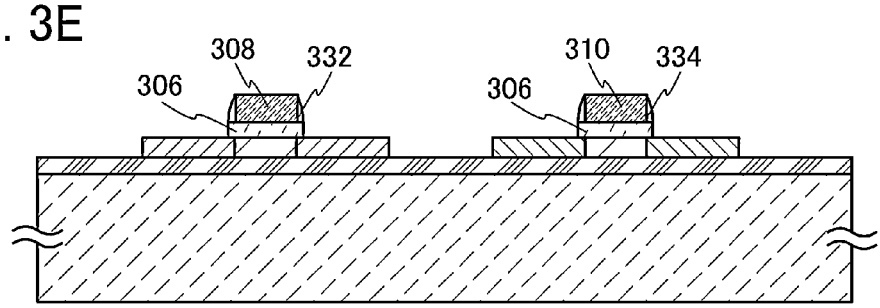

Next, sidewall insulating films 332 and 334 are formed to cover side surfaces of the gate electrodes 308 and 310, respectively (see FIG. 3E).

The sidewall insulating film 332 may be formed in the following manner for example: an insulating film using silicon oxide, silicon nitride, silicon oxynitride, silicon nitride oxide, aluminum oxide, or the like is formed over the insulating layer 306, the gate electrode 308, and the gate electrode 310 to have a single layer or a stacked layer by a CVD method such as a plasma CVD method or a PVD method such as a sputtering method, and the insulating film is etched by anisotropic etching in a perpendicular direction to the surface of the SOI substrate. The sidewall insulating film 334 can be formed in a similar manner. Note that in FIG. 3E, the insulating layer 306 is also etched by the anisotropic etching; however, such a structure is not necessarily employed. Further, in FIG. 3E, the sidewall insulating films 332 and 334 are formed to cover the side surfaces of the gate electrodes 308 and 310, respectively;

however, the sidewall insulating films 332 and 334 may be formed to cover the side surfaces and top surfaces of the gate electrodes 308 and 310, respectively.

Figure 4A:
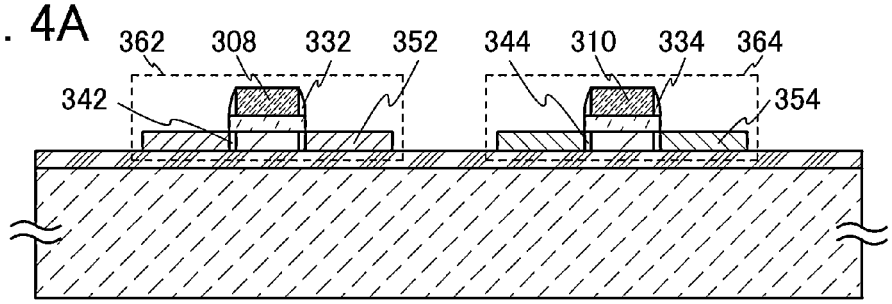
FIGS. 4A to 4D illustrate the semiconductor device.
Figure 4B:
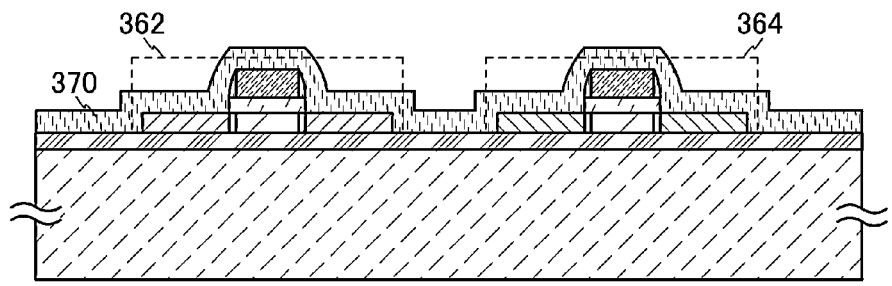

Next, an n-type low-concentration impurity region 342 and an n-type high-concentration impurity region 352 are formed in the n-type impurity region 312 and a p-type low-concentration impurity region 344 and a p-type high-concentration impurity region 354 are formed in the p-type impurity region 314 (see FIG. 4A).

The n-type low-concentration impurity region 342 and the n-type high-concentration impurity region 352 are formed in the n-type impurity region 312 in the following manner: a resist mask is formed over the p-type impurity region 314 and the channel formation region 324 and then an impurity element imparting n-type conductivity is added to the n-type impurity region 312 using the gate electrode 308 and the sidewall insulating film 332 as a mask by an ion doping method or an ion implantation method. The sidewall insulating film 332 is formed over part of the n-type impurity region 312; therefore, the n-type low-concentration impurity region 342 and the n-type high-concentration impurity region 352 are formed in the n-type impurity region 312 in a self-aligned manner by the addition of the impurity elements. Note that the n-type high-concentration impurity region 352 and the n-type low-concentration impurity region 342 serve as a source region or a drain region.

Then, after removal of the resist mask over the p-type impurity region 314 and the channel formation region 324, an impurity element imparting p-type conductivity is added to the p-type impurity region 314 by a method similar to the above to form the p-type low-concentration impurity region 344 and the p-type high-concentration impurity region 354. Note that the p-type high-concentration impurity region 354 and the p-type low-concentration impurity region 344 serve as a source region or a drain region.

Through the above steps, a semiconductor device including an n-channel transistor 362 and a p-channel transistor 364 can be manufactured (see FIG. 4A). Note that after the formation of the n-type low-concentration impurity region 342, the n-type high-concentration impurity region 352, the p-type low-concentration impurity region 344, and the p-type high-concentration impurity region 354, heat treatment for activating the impurity elements may be performed.

Figure 4C:
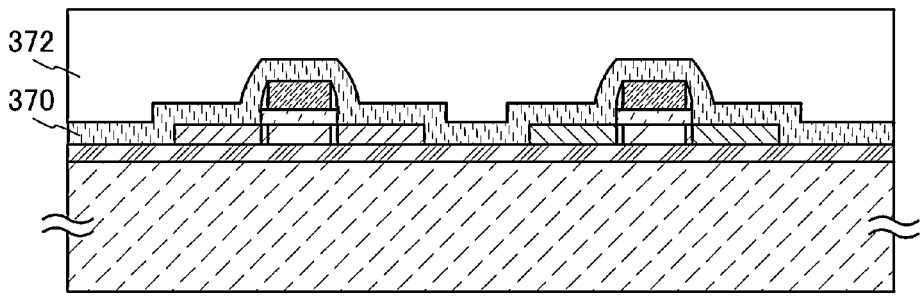

Next, an insulating layer 370 is formed over the n-channel transistor 362 and the p-channel transistor 364 (see FIG. 4C).

The insulating layer 370 may be formed in the following manner: an insulating film using silicon oxide, silicon nitride, silicon oxynitride, aluminum oxide, or the like is formed over the n-channel transistor 362 and the p-channel transistor 364 to have a single layer or a stacked layer by a CVD method such as a plasma CVD method or a PVD method such as a sputtering method. Note that it is preferable that the insulating layer 370 include hydrogen. Thus, when heat treatment is performed at a temperature of higher than or equal to 350° C. and lower than or equal to 450° C. after the insulating layer 370 is formed, hydrogen contained in the insulating layer 370 can be diffused to the channel formation regions 322 and 324. By supply of hydrogen to the channel formation regions 322 and 324, defects which serve as trapping centers in the channel formation regions 322 and 324 or at the interfaces between the channel formation regions and the insulating layer 306 can be repaired effectively.

Next, an interlayer insulating layer 372 is formed to cover the insulating layer 370 (see FIG. 4C). As a material of the interlayer insulating layer 372, an insulating film containing an inorganic material, such as a silicon oxide film or an organic resin film of polyimide or the like, can be used, for example. The interlayer insulating layer 372 may have a single-layer structure or a stacked-layer structure.

Figure 4D:
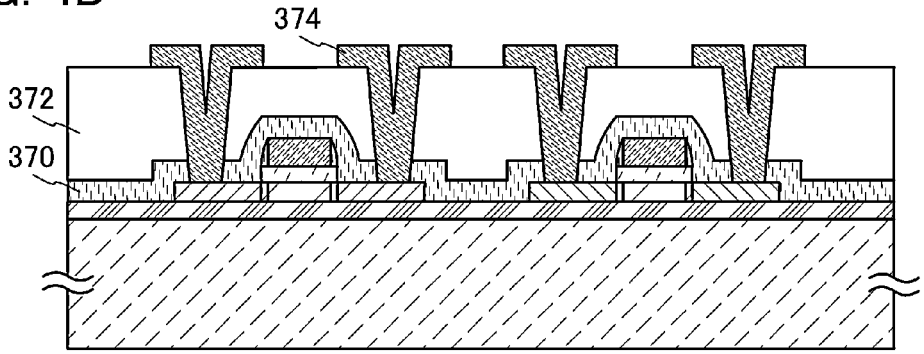

Next, after contact holes are formed in the insulating layer 370 and the interlayer insulating layer 372, a wiring layer 374 is formed (see FIG. 4D). The wiring layer 374 is electrically connected to the source regions and the drain regions. Further, the wiring layer 374 may be formed of a film including an element selected from tantalum (Ta), tungsten (W), titanium (Ti), molybdenum (Mo), aluminum (Al), copper (Cu), chromium (Cr), and neodymium (Nd); or an alloy material or compound material mainly containing the element by a physical vapor deposition (PVD) method such as a vacuum evaporation method or a sputtering method or a chemical vapor deposition (CVD) method such as a plasma CVD method, for example. Further, as a conductive film, a semiconductor film typified by a polycrystalline silicon film doped with an impurity element such as phosphorus or an AgPdCu alloy film may be used.

Although this embodiment describes the method for manufacturing the n-channel transistor and the p-channel transistor as an example of a semiconductor device, the semiconductor device can be manufactured so as to have high added value by forming semiconductor elements such as a capacitor and a resistor together with the transistors.

(Embodiment 3)

In this embodiment, an example of a structure of a semiconductor device using an SOI substrate manufactured by the method described in Embodiment 1 is described with reference to FIGS. 5A to 5C.

Figure 5A:
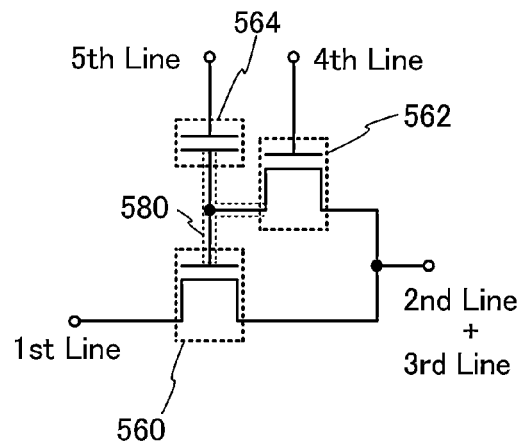
FIGS. 5A to 5C illustrate a semiconductor device.
Figure 5B:
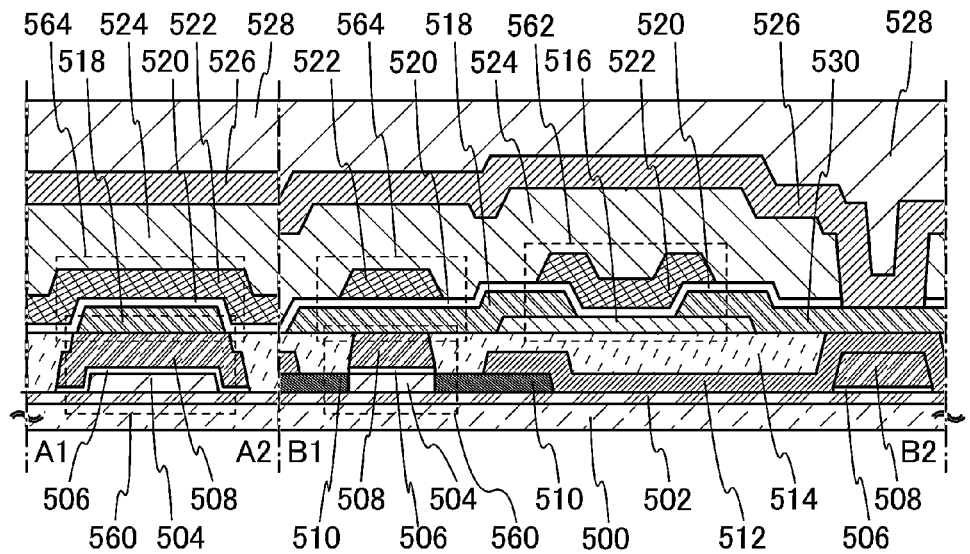
Figure 5C:
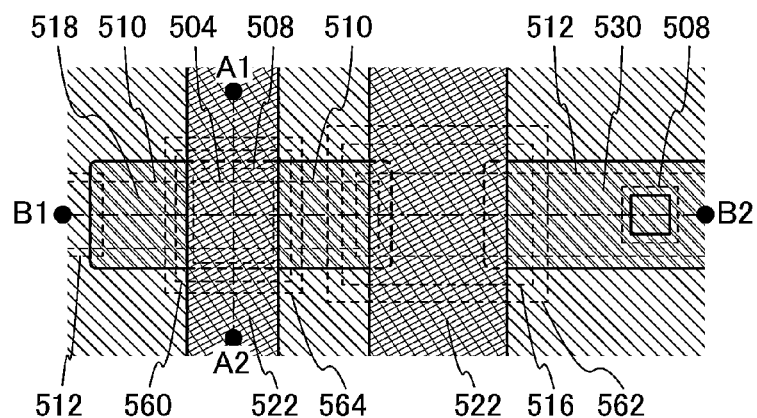

FIGS. 5A to 5C illustrate an example of a structure of a memory cell, which is manufactured using an SOI substrate manufactured by the method described in Embodiment 1.

FIG. 5A is an example of a circuit diagram illustrating part of a memory cell, FIG. 5B is an example of a cross-sectional view of the memory cell in the circuit diagram in FIG. 5A, and FIG. 5C is an example of a plan view of the memory cell in the circuit diagram in FIG. 5A. Note that FIG. 5B is a cross-sectional view taken along line A1-A2 and line B1-B2 in FIG. 5C. Note that some of the layers and the like are not shown in FIG. 5C for easy understanding of the structure of the semiconductor device.

The memory cell described in this embodiment includes a transistor 560 including a first semiconductor material in a lower portion and a transistor 562 including a second semiconductor material in an upper portion, as described in FIG. 5B. Here, the first semiconductor material is preferably different from the second semiconductor material. For example, as the first semiconductor material and the second semiconductor material, an oxide semiconductor and a semiconductor material other than an oxide semiconductor, respectively, may be used.

The semiconductor material other than an oxide semiconductor can be, for example, silicon, germanium, silicon germanium, silicon carbide, gallium arsenide, or indium phosphide. In particular, a semiconductor having a single crystal structure is preferably used. A transistor including such a semiconductor material can operate at high speed easily.

Further, a transistor including an oxide semiconductor as a semiconductor material has a characteristic of a significantly small off current. Therefore, charge can be held for a long time in a region (a node 580) connected to the transistor 560, the transistor 562, and a capacitor 564, which is shown in FIG. 5A, so that power consumption of the memory cell can be reduced. Note that the transistor including an oxide semiconductor as a semiconductor material and characteristics of a stacked-layer structure of the transistor including a material other than an oxide semiconductor as a semiconductor layer and the transistor including an oxide semiconductor material as a semiconductor layer are described in detail in Embodiment 6.

For the transistor 560 in a lower portion than the transistor 562, which are shown in FIG. 5B, the SOI substrate 210 described in Embodiment 1 can be used. That is, the base substrate 200 and the insulating layer 102 in Embodiment 1 correspond to a base substrate 500 and an insulating layer 502 in this embodiment, respectively. Further, a channel formation region 504 and impurity regions 510 in this embodiment can be formed using the semiconductor thin film layer 110 in Embodiment 1.

The transistor 560 in FIGS. 5A to 5C includes a channel formation region 504 provided in a semiconductor layer over the base substrate 500, impurity regions 510 (also referred to as a source region and a drain region) with the channel formation region 504 provided therebetween, a gate insulating layer 506 provided over the channel formation region 504, and a gate electrode 508 provided over the gate insulating layer 506 so as to overlap with the channel formation region 504.

Further, a conductive layer 512 is connected to the impurity regions 510 provided in the semiconductor layer over the base substrate 500. Here, the conductive layer 512 serves as a source electrode or a drain electrode of the transistor 560. Further, an insulating layer 514 is provided to cover the transistor 560. Note that although the insulating layer 514 is a single layer in FIG. 5B, it may be a stacked layer of a plurality of films.

Note that in order to obtain high integration, the transistor 560 preferably does not have a sidewall insulating film as shown in FIG. 5B. On the other hand, in the case where characteristics of the transistor 560 have priority, a sidewall insulating film may be provided on a side surface of the gate electrode 508, and the impurity regions 510 may include regions having different impurity concentrations.

The transistor 562 in FIGS. 5A to 5C includes an oxide semiconductor layer 516 provided over the insulating layer 514 or the like, a conductive layer 518 and a conductive layer 530 electrically connected to the oxide semiconductor layer 516 and serving as a source electrode or a drain electrode, a gate insulating layer 520 covering the oxide semiconductor layer 516, the conductive layer 518, and the conductive layer 530, a gate electrode 522 provided over the gate insulating layer 520 so as to overlap with the oxide semiconductor layer 516. Note that in FIG. 5B, the conductive layer 518 and the conductive layer 530 are electrically connected to a top surface (and a side surface) of the oxide semiconductor layer 516 (what is called a top contact structure); however, the oxide semiconductor layer 516 may be formed after the conductive layer 518 and the conductive layer 530 are formed, whereby the conductive layer 518 and the conductive layer 530 are electrically connected to a bottom surface (and a side surface) of the oxide semiconductor layer 516 (what is called a bottom contact structure).

The capacitor 564 in FIG. 5A to 5C includes the conductive layer 518, the gate insulating layer 520, and the gate electrode 522. That is, the conductive layer 518 serves as one electrode of the capacitor 564, and the gate electrode 522 serves as the other electrode of the capacitor 564. With such a structure, capacitance can be sufficiently secured. Further, in the case where the transistor 562 has a bottom contact structure, insulation between the conductive layer 518 and the gate electrode 522 can be sufficiently secured by a stack of the oxide semiconductor layer 516 and the gate insulating layer 520. Note that in the case where a capacitor is not needed, the capacitor 564 may be omitted.

In this embodiment, the transistor 562 and the capacitor 564 are provided so as to overlap with the transistor 560 at least partly. By employing such a planar layout, high integration can be realized. For example, given that the minimum feature size is F, the area occupied by a memory cell can be $15F^2$ to $25F^2$.

An insulating layer 524 is provided over the transistor 562 and the capacitor 564 and a wiring layer 526 is provided over the insulating layer 524. The wiring layer 526 is electrically connected to the conductive layer 530 serving as a source electrode or a drain electrode of the transistor 562 through an opening provided in the gate insulating layer 520 and the insulating layer 524, and the conductive layer 512 serving as a source electrode or a drain electrode of the transistor 560. The number of wirings in the above structure can be smaller than that of a structure in which the conductive layer 530 and the conductive layer 512 are connected to different wirings. Thus, the degree of integration of the semiconductor device can be increased. Further, an insulating layer 528 is formed over the wiring layer 526.

Furthermore, with a layout in which the conductive layer 512, the conductive layer 530, and the wiring layer 526 are electrically connected to each other at one portion as shown in FIG. 5A to 5C, an increase in element area due to a contact region can be prevented and thus the degree of integration of the semiconductor device can be increased.

A plurality of the memory cells in FIGS. 5A and 5C is connected in series, whereby a NAND memory cell array can be formed. On the other hand, when the memory cells are connected in parallel, a NOR memory cell array can be formed.

As described above, with the use of an SOI substrate manufactured by the method described in Embodiment 1, the transistor 560 can operate at high speed and have stable electric characteristics. Therefore, a semiconductor device provided with a high-performance memory cell can be manufactured with high yield, so that production cost can be reduced.

(Embodiment 4)

In this embodiment, an example of a structure of a semiconductor device using an SOI substrate manufactured by the method described in Embodiment 1 is described with reference to FIGS. 6A and 6B and FIGS. 7A and 7B.

Figure 6A:
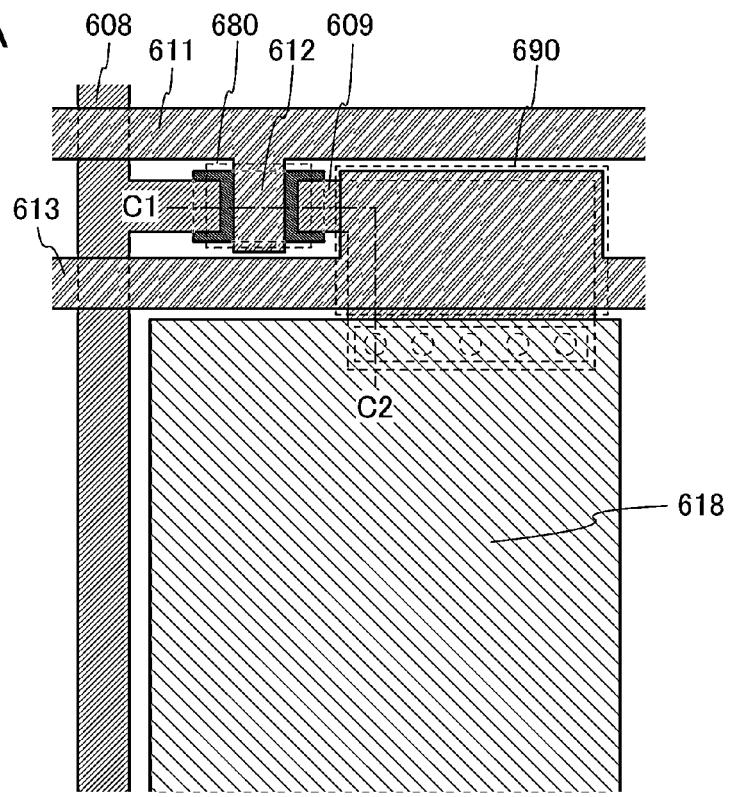
FIGS. 6A and 6B illustrate a semiconductor device.
Figure 6B:
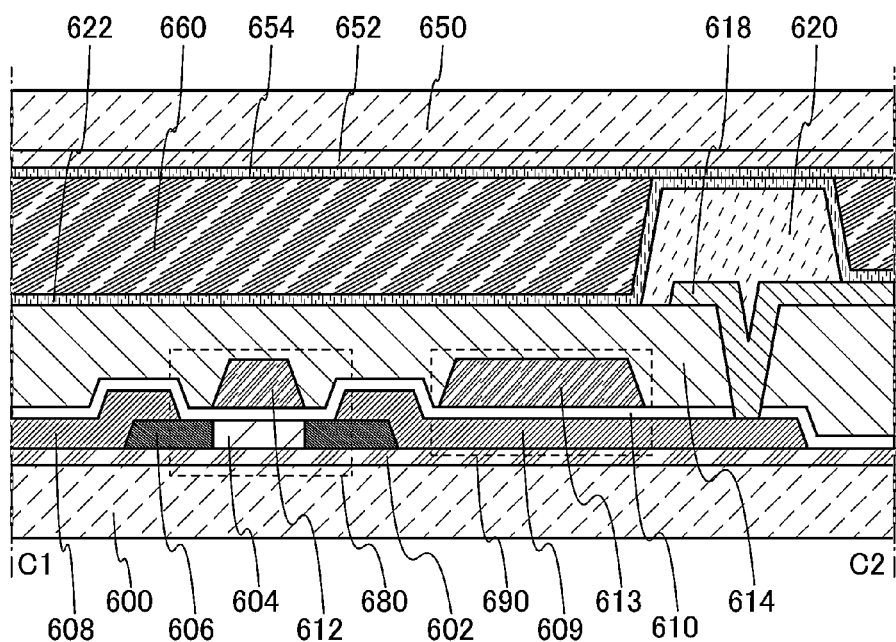
Figure 7A:
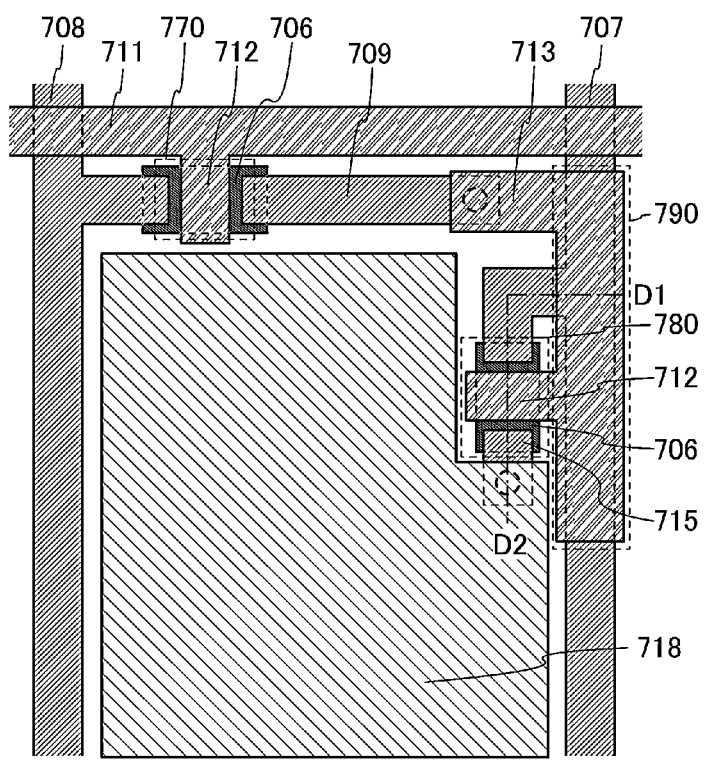
FIGS. 7A and 7B illustrate a semiconductor device.
Figure 7B:
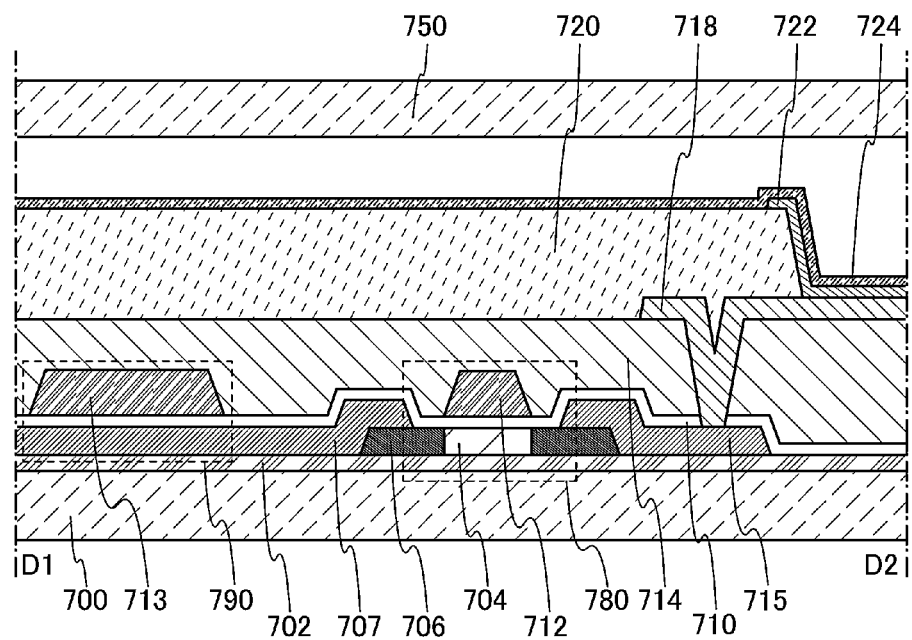

FIGS. 6A and 6B illustrate a structure example of part (pixel portion) of a liquid crystal display device, which is manufactured using an SOI substrate manufactured by the method described in Embodiment 1. Further, FIGS. 7A and 7B illustrate a structure example of part (pixel portion) of an electroluminescent display device (hereinafter referred to as an "EL display device"), which is manufactured using an SOI substrate manufactured by the method described in Embodiment 1.

FIG. 6A is an example of a top view of the pixel portion of the liquid crystal display device and FIG. 6B is a cross-sectional view taken along line C1-C2 in FIG. 6A. Note that some of the layers and the like are not shown in FIG. 6A for easy understanding of the structure of the semiconductor device.

As shown in FIGS. 6A and 6B, the pixel portion of the liquid crystal display device includes a signal line 608; a scan line 611 and a capacitor line 613 which intersect with the signal line 608; a pixel electrode 618; a transistor 680 by which whether a signal from the signal line 608 is input to the pixel electrode 618 is determined; a capacitor 690; and a wiring layer 609 for electrically connecting the pixel electrode 618 and the transistor 680. Note that part of the signal line 608 and part of the wiring layer 609 serve as a source electrode or a drain electrode of the transistor 680. Further, part of the scan line 611 serves as a gate electrode of the transistor 680; therefore, the scan line 611 includes a gate electrode 612.

Note that in FIGS. 6A and 6B, the wiring layer 609 and the signal line 608 are formed using the same material and the same step; therefore, they are the same in spite of their different names for easy understanding of the structure. Similarly, the scan line 611 and the capacitor line 613 are the same.

For the transistor 680 in FIG. 6B, the SOI substrate 210 described in Embodiment 1 can be used. That is, the base substrate 200 and the insulating layer 102 in Embodiment 1 correspond to a base substrate 600 and an insulating layer 602 in this embodiment, respectively. Further, a channel formation region 604 and impurity regions 606 in this embodiment can be formed using the semiconductor thin film layer 110 in Embodiment 1.

The transistor 680 in FIGS. 6A and 6B includes a channel formation region 604 provided in a semiconductor layer over the base substrate 600, impurity regions 606 to which an n-type impurity element or a p-type impurity element is added (also referred to as a source region and a drain region) with the channel formation region 604 provided therebetween, the signal line 608 and the wiring layer 609 electrically connected to the impurity regions 606, a gate insulating layer 610 provided over the channel formation region 604, and the gate electrode 612 provided over the gate insulating layer 610 so as to overlap with the channel formation region 604. Note that the channel formation region 604 and the impurity regions 606 are formed using a semiconductor layer having an island shape, which is obtained by element isolation of the semiconductor layer of the SOI substrate by etching or the like. Then, an insulating layer 614 is provided so as to cover the transistor 680.

Note that although the insulating layer 614 is a single layer in FIG. 6B, it may be a stacked layer of a plurality of films.

The capacitor 690 in FIGS. 6A and 6B includes the wiring layer 609, the gate insulating layer 610, and the capacitor line 613. That is, the wiring layer 609 serves as one electrode of the capacitor 690, and the capacitor line 613 serves as the other electrode of the capacitor 690. With such a structure, capacitance can be sufficiently secured.

The pixel electrode 618 is provided over the insulating layer 614 and is electrically connected to the wiring layer 609 through an opening portion in the gate insulating layer 610 and the insulating layer 614. Further, a spacer 620 is provided over the insulating layer 614. Then, an alignment film 622 is provided so as to cover the insulating layer 614 and the spacer 620. Note that the spacer 620 has a function of forming a space between the base substrate 600 and a counter substrate 650.

The counter substrate 650 is provided with a counter electrode 652 and an alignment film 654 covering the counter electrode 652. Then, a liquid crystal layer 660 is formed in the space between the alignment film 622 and the alignment film 654, which is formed by the spacer 620.

Note that a connection portion between the wiring layer 609 and the pixel electrode 618 is a portion where the opening portion is formed in the gate insulating layer 610 and the insulating layer 614 and steps are generated; therefore, orientation of liquid crystals in the liquid crystal layer 660 is likely to be disordered at the portion. Accordingly, the spacer 620 is formed over the portion, so that the disorder of orientation of liquid crystals in the liquid crystal layer 660 can be prevented.

As described above, with the use of an SOI substrate manufactured by the method described in Embodiment 1, the transistor 680 can operate at high speed and have stable electric characteristics. Therefore, a high-performance liquid crystal display device can be manufactured with high yield, so that production cost can be reduced.

Next, a structural example of an EL display device is described with reference to FIGS. 7A and 7B.

FIG. 7A is an example of a top view of a pixel portion of the EL display device and FIG. 7B is a cross-sectional view taken along line D1-D2 in FIG. 7A. Note that some of the layers and the like are not shown in FIG. 7B for easy understanding of the structure of the semiconductor device.

As shown in FIGS. 7A and 7B, the pixel portion of the EL display device includes a power supply line 707, a signal line 708, a scan line 711 intersecting with the power supply line 707 and the signal line 708, a capacitor line 713, a pixel electrode 718, a selection transistor 770 for selecting a pixel to which a signal from the signal line 708 is input, a display control transistor 780 by which whether a signal input through the selection transistor is input to the pixel electrode is determined, and a capacitor 790.

Note that part of the signal line 708 and a wiring layer 709 serve as a source electrode or a drain electrode of the selection transistor 770 and part of the power supply line 707 and a wiring layer 715 serve as a source electrode or a drain electrode of the display control transistor 780. Further, part of the scan line 711 and part of the capacitor line 713 serve as a gate electrode of the selection transistor 770 and a gate electrode of the display control transistor 780, respectively; therefore, the scan line 711 and the capacitor line 713 each include a gate electrode 712.

Note that in FIGS. 7A and 7B, the power supply line 707, the signal line 708, the wiring layer 709, the wiring layer 715 are formed using the same material and the same step; therefore, they are the same in spite of their different names for easy understanding of the structure. Similarly, the scan line 711 and the capacitor line 713 are the same.

For the display control transistor 780 in FIG. 7B, the SOI substrate 210 described in Embodiment 1 can be used. That is, the base substrate 200 and the insulating layer 102 in Embodiment 1 correspond to a base substrate 700 and an insulating layer 702 in this embodiment, respectively. Further, a channel formation region 704 and impurity regions 706 in this embodiment can be formed using the semiconductor thin film layer 110 in Embodiment 1.

The display control transistor 780 in FIGS. 7A and 7B includes a channel formation region 704 provided in a semiconductor layer over the base substrate 700, impurity regions 706 to which an n-type impurity element or a p-type impurity element is added (also referred to as a source region and a drain region) with the channel formation region 704 provided therebetween, the power supply line 707 and the wiring layer 715 electrically connected to the impurity regions 706, a gate insulating layer 710 provided over the channel formation region 704, and the gate electrode 712 provided over the gate insulating layer 710 so as to overlap with the channel formation region 704. Note that the channel formation region 704 and the impurity regions 706 are formed using a semiconductor layer having an island shape, which is obtained by element isolation of the semiconductor layer of the SOI substrate by etching or the like. Then, an insulating layer 714 is provided so as to cover the display control transistor 780 and the selection transistor 770. Note that although the structure of the selection transistor 770 is not shown in FIG. 7B, the selection transistor 770 may have a structure similar to that of the display control transistor 780 except that the power supply line 707 and the wiring layer 709 are electrically connected to the impurity regions 706.

Note that although the insulating layer 714 is a single layer in FIG. 7B, it may be a stacked layer of a plurality of films.

The capacitor 790 in FIGS. 7A and 7B includes the power supply line 707, the gate insulating layer 710, and the capacitor line 713. That is, the power supply line 707 serves as one electrode of the capacitor 790, and the capacitor line 713 serves as the other electrode of the capacitor 790. With such a structure, capacitance can be sufficiently secured.

The pixel electrode 718 is provided over the insulating layer 714 and is electrically connected to the wiring layer 715 led from the display control transistor 780 through an opening portion in the gate insulating layer 710 and the insulating layer 714. Then, an insulating partition layer 720 is formed in a peripheral portion of the pixel electrode 718 so as to cover an end portion of the pixel electrode 718.

A layer containing a material which emits light by application of an electric field (hereinafter referred to as an "EL layer") is formed over the pixel electrode 718, and a counter electrode 724 is formed over an EL layer 722. Further, in order to suppress deterioration of the EL layer due to external oxygen (oxygen in the air) or water vapor, a counter substrate 750 is fixed to the base substrate 700 by an adhesive material (not shown).

The grayscale of the EL display device is controlled by a current drive method in which the luminance of the EL layer is controlled by the amount of current or a voltage drive method in which the luminance is controlled by the amount of voltage. The current drive method is difficult to be employed when transistors have characteristics which are largely different between pixels, and therefore a compensation circuit for compensating variation in characteristics is necessary. However, in the EL display device in this embodiment, the selection transistor 770 and the display control transistor 780 are formed using an SOI substrate described in the above embodiment, whereby variation in characteristics of the selection transistor 770 and the display control transistor 780 which are provided in each pixel is suppressed. Therefore, a current drive method can be positively employed.

As described above, with the use of an SOI substrate manufactured by the method described in Embodiment 1, the display control transistor 780 can operate at high speed and have stable electric characteristics. Therefore, a high-performance EL display device can be manufactured with high yield, so that production cost can be reduced.

(Embodiment 5)

In this embodiment, an example of the case where any of the semiconductor devices described in the above embodiments is applied to an electronic device is described.

Examples of electronic devices are as follows: cameras such as video cameras and digital cameras; navigation systems; sound reproduction devices (such as car audio systems and audio components); computers; game machines; portable information terminals (such as mobile computers, mobile phones, portable game machines, and electronic book readers); image reproduction devices each having a function of reproducing data in a recording medium (specifically, display devices that are each capable of reproducing audio data stored in a recording medium such as a digital versatile disc (DVD) or a Blu-ray Disc and displaying image data stored therein); and the like. Examples of these devices are shown in FIGS. 8A to 8C.

Figure 8A:
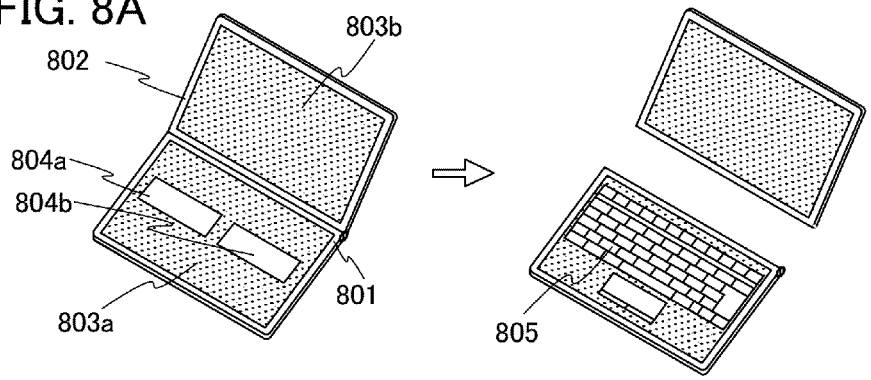
FIGS. 8A to 8C each illustrate an example of an electronic device using an SOI substrate.
Figure 8B:
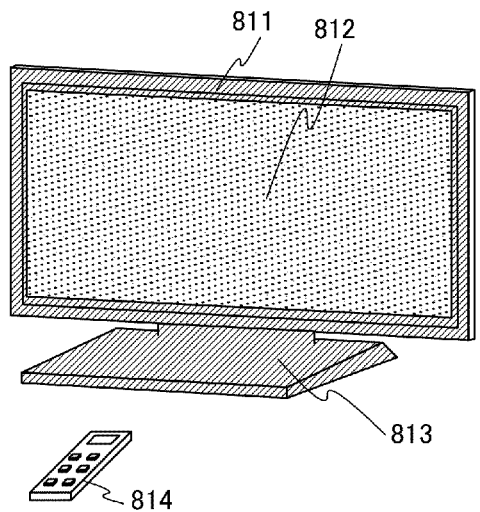
Figure 8C:
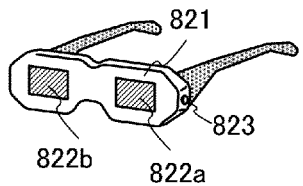
Figure 8C:
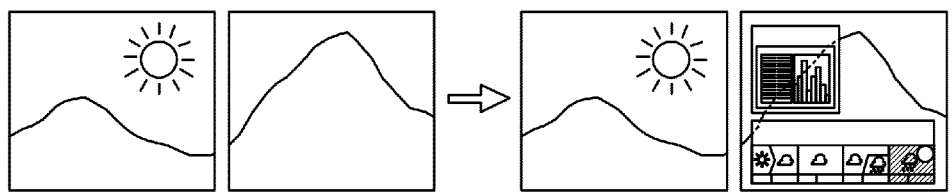

FIG. 8A illustrates a portable information terminal including a main body 801, a housing 802, a first display portion 803a, a second display portion 803b, and the like.

At least one of the first display portion 803a and the second display portion 803b is a touch panel, and for example, as shown in a left part in FIG. 8A, which of "touch input" and "keyboard input" is performed can be selected by selection buttons 804a and 804b displayed on the first display portion 803a. Since the selection button with a variety of sizes can be displayed, the portable information terminal can be easily used by people of any generation. In the case where "keyboard input" is selected, for example, a keyboard 805 is displayed on the first display portion 803a as shown in a right part of FIG. 8A. With the keyboard 805, letters can be input quickly by keyboard input as in the case of using a conventional information terminal, for example.

In the portable information terminal shown in FIG. 8A, the main body 801 and the housing 802 can be separated as in the right part of FIG. 8A. Therefore, screen data can be controlled from the main body 801 while the screen data is shared by a plurality of people with the housing 802 hung on a wall, which is very convenient. Note that the first display portion 803a and the second display portion 803b preferably overlap with each other so as to face each other when the device is not used. In this manner, the first display portion 803a and the second display portion 803b can be protected from external impact or the like.

The portable information terminal shown in FIG. 8A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Furthermore, an external connection terminal (an earphone terminal, a USB terminal, or the like), a recording medium insertion portion, and the like may be provided on the back surface or the side surface of the housing.

The portable information terminal shown in FIG. 8A may transmit and receive data wirelessly. Through wireless communication, desired book data or the like can be purchased and downloaded from an electronic book server.

Further, the housing 802 shown in FIG. 8A may be equipped with an antenna, a microphone function, and a wireless communication function to be used as a mobile phone.

A semiconductor device using an SOI substrate manufactured by the method described in Embodiment 1 is used for a variety of semiconductor devices such as a CPU or a memory provided in the housing 802, or a variety of semiconductor devices provided in the first display portion 803a and the second display portion 803b, whereby a portable information terminal with a high-value-added function which can operate at high speed while consuming low power, for example, can be provided.

FIG. 8B is a television device including a housing 811, a display portion 812, a stand 813, and the like. The television device can be operated by a switch of the housing 811 or a remote controller 814. In such a television device, a semiconductor device using an SOI substrate manufactured by the method described in Embodiment 1 is used for the display portion 812 and a variety of semiconductor devices such as a CPU or a memory provided in the housing 811 or the like, whereby a high-value-added television device with an excellent display capability or low power consumption can be provided.

FIG. 8C illustrates one mode of a goggle-type display (head mounted display). In an image display device shown in FIG. 8C, a left-eye panel 822a, a right-eye panel 822b, and an image display button 823 are provided for a housing 821. In such a goggle-type display, a semiconductor device using an SOI substrate manufactured by the method described in Embodiment 1 is used for a variety of semiconductor devices such as a CPU or a memory provided in the housing 821, the left-eye panel 822a, the right-eye panel 822b, or the like, whereby a high-value-added goggle-type display with an excellent display capability or low power consumption can be provided.

Further, in the method for manufacturing a semiconductor device disclosed in this specification, a light-transmitting substrate (e.g., a glass substrate) is used as a base substrate (including a counter substrate in the case of an EL display device) and a light-transmitting layer (e.g., a light-transmitting conductive material such as indium tin oxide including silicon oxide (ITSO), indium tin oxide (ITO), zinc oxide (ZnO), indium zinc oxide, or gallium-doped zinc oxide (GZO)) is used for a variety of electrodes such as a source electrode, a drain electrode, a gate electrode, or a pixel electrode, whereby an image display device having a light-transmitting property (e.g., a visible light transmittance of 50% or higher) can be formed. Consequently, users can view the outside sight through the left-eye panel 822a and the right-eye panel 822b, so that users can view the sight as with normal eye glasses, as shown in the bottom left in FIG. 8C; further, to obtain necessary information, users push an image display button 823, so that the necessary information (image) is displayed on one or both of the left-eye panel 822a and the right-eye panel 822b as shown in the bottom right in FIG. 8C. Therefore, it can be said that it is preferable when the goggle-type display is used in the above manner.

(Embodiment 6)

In this embodiment, the transistor including an oxide semiconductor as a semiconductor material and characteristics of a stacked-layer structure of the transistor including a material other than an oxide semiconductor as a semiconductor layer and the transistor including an oxide semiconductor material as a semiconductor layer are described.

Figure 17:
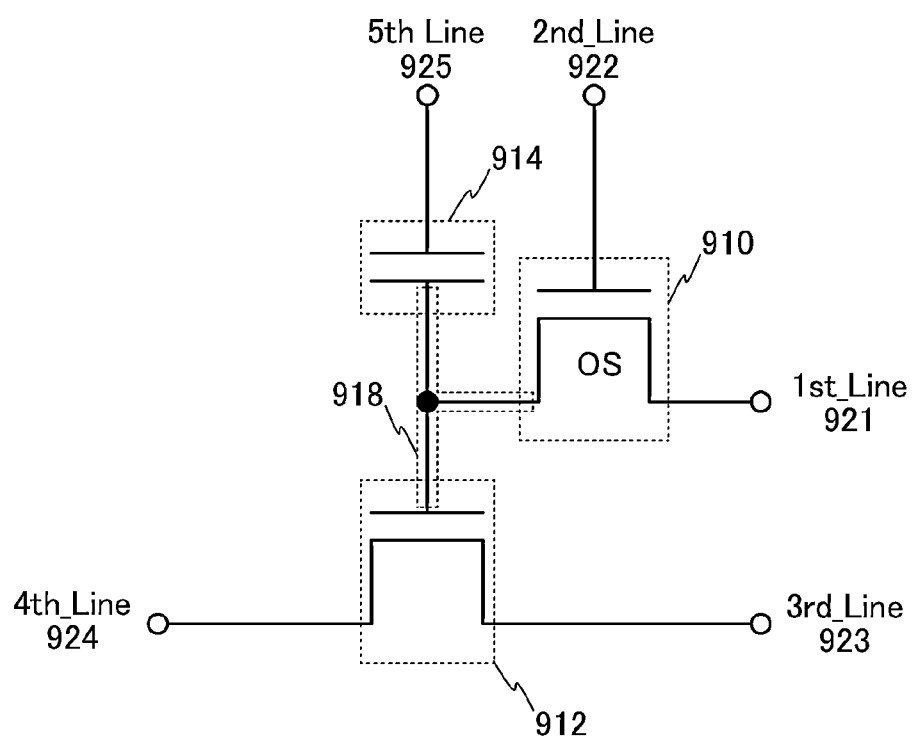
FIG. 17 illustrates a circuit configuration of a memory cell.

FIG. 17 illustrates an example of a memory cell which is different from the memory cell described in Embodiment 3, and this embodiment is described using the memory cell.

As shown in FIG. 17, the memory cell described in this embodiment includes a first transistor 910, a second transistor 912, and a capacitor 914, in which one of a source and a drain of the first transistor 910 is connected to a first line 921 (1st line), a gate of the first transistor 910 is connected to a second line 922 (2nd line), one of a source and a drain of the second transistor 912 is connected to a third line 923 (3rd line), and the other of the source and the drain of the second transistor 912 is connected to a fourth line 924 (4th line). Further, one of electrodes of the capacitor 914 is connected to the other of the source and the drain of the first transistor 910 and a gate of the second transistor 912, and the other of the electrodes of the capacitor 914 is connected to a fifth line 925 (5th line).

As shown in FIG. 17, the first transistor 910 is a transistor including an oxide semiconductor material as a semiconductor layer (hereinafter also referred to as an "OS transistor"); therefore, the first transistor 910 is turned on by a signal from the second line 922, and the first transistor 910 is turned off by the signal from the second line 922 while a signal from the first line 921 is supplied to the gate of the second transistor 912 and the one of the electrodes of the capacitor 914. In this manner, a signal input through the first line 921 can be stored in a region (which corresponds to a node 918 in FIG. 17) among the other of the source and the drain of the first transistor 910, the gate of the second transistor 912, and one of the electrodes of the capacitor 914 for a long time even when power is not supplied to the memory cell (writing).

For data reading, an appropriate potential (a reading potential) is applied to the fifth line 925 while a predetermined potential (a constant potential) is supplied to the third line 923 first, whereby the potential of the fourth line 924 varies depending on the amount of charge stored in the node 918. This is because in general, when the transistor 912 is an n-channel transistor, an apparent threshold voltage $V_{th\_H}$ in the case where a high-level charge is given to the gate electrode of the transistor 912 is lower than an apparent threshold voltage $V_{th\_L}$ in the case where a low-level charge is given to the gate electrode of the transistor 912. Here, the apparent threshold voltage refers to the potential of the fifth line 925, which is needed to turn on the transistor 912. Thus, by setting the potential of the fifth line 925 to a potential $V_0$ which is between $V_{th\_H}$ and $V_{th\_L}$, charge given to the gate of the transistor 912 can be determined. For example, in the case where a high-level charge is given in writing, when the potential of the fifth line 925 is set to $V_0$ ($>V_{th\_H}$), the transistor 912 is turned on. In the case where a low-level charge is given in writing, even when the potential of the fifth line 925 is set to $V_0$ ($<V_{th\_L}$), the transistor 912 remains in an off state. Therefore, the stored data can be read out by checking the potential of the fourth line 924.

Note that in the case where memory cells are arrayed to be used, only data of desired memory cells needs to be read. In the case where such reading is not performed, a potential at which the transistor 912 is turned off, that is, a potential smaller than $V_{th\_H}$ may be given to the fifth line 925 regardless of the state of the gate of the transistor 912. Alternatively, a potential at which the transistor 912 is turned on, that is, a potential higher than $V_{th\_L}$ may be given to the fifth line 925 regardless of the state of the gate of the transistor 912.

The first transistor 910, which is an OS transistor, can be formed using the same apparatus and method as those of a thin film transistor using silicon or the like; therefore, there is an advantage that it can reduce the load of new capital investment or a study of the manufacturing method. Further, the OS transistor and a transistor including a material other than an oxide semiconductor as a semiconductor layer (e.g., a transistor including single crystal silicon as a semiconductor layer, which is described in Embodiment 1) can be stacked.

Figure 18A:
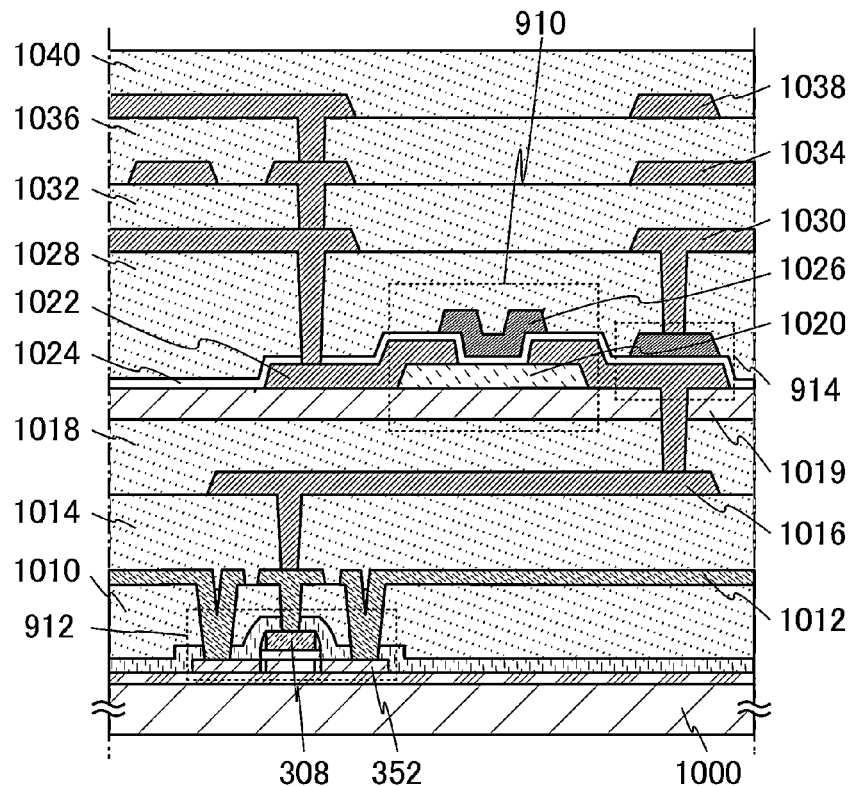
FIGS. 18A to 18C illustrate structures of a memory cell.

Here, FIG. 18A illustrates an example of a cross-sectional view of a memory cell in which a transistor including an oxide semiconductor material as a semiconductor layer for the first transistor 910 and a transistor including single crystal silicon as a semiconductor layer for the second transistor 912 are stacked, in the circuit configuration shown in FIG. 17.

FIG. 18A illustrates an example of a cross-sectional view of part of a memory cell in which the second transistor 912 including single crystal silicon as the semiconductor layer is provided over a substrate 1000 and the first transistor 910 including an oxide semiconductor material as the semiconductor layer is provided over the second transistor 912.

The second transistor 912 can have a similar structure to that of the transistor 362 in Embodiment 3.

Note that an impurity region 352 serving as a source or a drain of the second transistor 912 is electrically connected to a conductive film 1012 provided over an interlayer film 1010 covering the second transistor 912.

The first transistor 910 includes an oxide semiconductor film 1020 provided over an insulating film 1019, a conductive film 1022 electrically connected to the oxide semiconductor film 1020 and serving as the source and the drain of the first transistor 910, a gate insulating film 1024 provided over the oxide semiconductor film 1020, and a gate electrode 1026 provided over the oxide semiconductor film 1020 with the gate insulating film 1024 interposed therebetween.

As the insulating film 1019, with the use of a physical vapor deposition (PVD) method such as a vacuum evaporation method or a sputtering method or a chemical vapor deposition (CVD) method such as a plasma CVD method, a film deposited using an inorganic insulating film using silicon oxide, silicon nitride, silicon nitride oxide, silicon oxynitride, aluminum oxide, aluminum nitride, aluminum nitride oxide, or the like can be used.

Note that a film from which oxygen is released by heat treatment is preferably used as the insulating film 1019. The reason thereof is as follows: when oxygen vacancy exists in a channel formation region of the first transistor 910, electric charge is generated due to the oxygen vacancy in some cases. In general, part of oxygen vacancy in an oxide semiconductor film serves as a donor to release an electron which is a carrier. As a result, the threshold voltage of the transistor shifts in the negative direction.

When the insulating film 1019 is a film from which oxygen is released by heat treatment, part of oxygen in the oxygen supply film can be released by the heat treatment; therefore, the oxygen can be supplied to the oxide semiconductor film and oxygen vacancy in the oxide semiconductor film can be filled, which can suppress the shift of the threshold voltage of the transistor in the negative direction. In particular, the oxygen supply film preferably contains oxygen which exceeds at least the stoichiometric composition ratio. For example, in the case where silicon oxide is used for the oxygen supply film, a film of silicon oxide represented by $SiO_{2+\alpha}$ ($\alpha>0$) is preferably used. Note that a region containing a larger amount of oxygen than the stoichiometric composition ratio (hereinafter referred to as "an oxygen-excessive region" in some cases) may exist in at least part of the oxygen supply film.

Note that "a film from which oxygen is released by heat treatment" described above refers to a film whose amount of released oxygen when converted into oxygen atoms in thermal desorption spectroscopy (TDS) analysis is greater than or equal to $1.0\times10^{19}$ atoms/cm$^3$, preferably greater than or equal to $3.0\times10^{19}$ atoms/cm$^3$, further preferably greater than or equal to $1.0\times10^{20}$ atoms/cm$^3$, still further preferably greater than or equal to $3.0\times10^{20}$ atoms/cm$^3$.

Here, a method in which the amount of released oxygen is measured by being converted into oxygen atoms using the TDS analysis is described below.

The released amount of gas in the TDS analysis is proportional to an integral value of spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula (1) with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. CH$_3$OH, which is given as a gas where M/z=32, is not taken into consideration on the assumption that it is unlikely to be present. Further, an oxygen molecule including an oxygen atom where M/z=17 or 18 which is an isotope of an oxygen atom is not taken into consideration either because the proportion of such a molecule in the natural world is minimal.

[FORMULA 1]

$$N_{O2} = \frac{N_{H2}}{S_{H2}} \times S_{O2} \times \alpha \quad (1)$$

$N_{H2}$ is the value obtained by conversion of the number of hydrogen molecules desorbed from the standard sample into densities. $S_{H2}$ is the integral value of a spectrum when the standard sample is subjected to the TDS analysis. Here, the reference value of the standard sample is set to $N_{H2}/S_{H2}$. $S_{O2}$ is the integral value of a spectrum when the insulating film is subjected to the TDS analysis. $\alpha$ is a coefficient affecting the intensity of the spectrum in the TDS analysis. Refer to Japanese Published Patent Application No. H06-275697 for details of the Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

For the introduction of oxygen into the oxide semiconductor film, heat treatment performed under an oxygen atmosphere, an ion implantation method, an ion doping method, a plasma immersion ion implantation method, plasma treatment performed under an atmosphere containing oxygen, or the like can be employed.

Further, in the case where the hydrogen concentration in an insulating film containing excess oxygen is greater than or equal to $7.2\times10^{20}$ atoms/cm$^3$, variation in initial characteristics of the transistor is increased, a channel length dependence of electric characteristics of the transistor is increased, and the transistor is significantly deteriorated in the BT stress test; therefore, the hydrogen concentration in the insulating film containing excess oxygen is preferably less than $7.2\times10^{20}$ atoms/cm$^3$. In other words, the hydrogen concentration in the oxide semiconductor film is preferably less than or equal to $5\times10^{19}$ atoms/cm$^3$, and the hydrogen concentration in the insulating film containing excess oxygen is preferably less than $7.2\times10^{20}$ atoms/cm$^3$. A method for forming a film having a low hydrogen concentration is described in detail later.

Note that in the case where oxygen is supplied from the oxygen supply film to the oxide semiconductor film by heat treatment, it is preferable that a film having a low oxygen or water vapor permeability (also referred to as a low moisture permeability) be formed under the oxygen supply film (that is, to a surface of the oxygen supply film opposite to the surface in contact with the oxide semiconductor film) so that oxygen released from the oxygen supply film can be supplied to the oxide semiconductor film efficiently. For example, under the oxygen supply film, an aluminum oxide film, an aluminum oxynitride film, an aluminum nitride oxide film, or the like may be formed as a barrier film. In the case of using an aluminum oxide film, the aluminum oxide film preferably has a high density (film density of higher than or equal to 3.2 g/cm$^3$, preferably higher than or equal to 3.6 g/cm$^3$).

An oxide semiconductor material used for the oxide semiconductor film 1020 contains at least indium (In). In particular, In and zinc (Zn) are preferably contained. In addition, as a stabilizer for reducing variation in electric characteristics of a transistor formed using the oxide, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, a material represented by $In_2SnO_5(ZnO)_n$, (n>0 is satisfied, and n is an integer) may be used as the oxide semiconductor.

Further, an oxide semiconductor can also be used as the material for the oxide semiconductor film 1020. The oxide semiconductor film 1020 formed using an oxide semiconductor material is in a single crystal state, a polycrystalline (also referred to as polycrystal) state, an amorphous state, or the like.

The oxide semiconductor film 1020 preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

In the case where the CAAC-OS film is deposited as the oxide semiconductor film 1020, any of the following three methods may be employed. The first is a method in which an oxide semiconductor film is deposited at a temperature higher than or equal to 200° C. and lower than or equal to 450° C. by a PVD method such as a sputtering method, so that the oxide semiconductor film serves as a CAAC-OS film. The second is a method in which after an oxide semiconductor film is deposited by a PVD method such as a sputtering method, heat treatment is performed on the first oxide semiconductor film at a temperature higher than or equal to 200° C. and lower than or equal to 700° C., so that the oxide semiconductor film serves as a CAAC-OS film. The third is a method in which two layers are deposited for formation of an oxide semiconductor film by a PVD method such as a sputtering method. After a first oxide semiconductor film with a small thickness is deposited, heat treatment is performed on the oxide semiconductor film at a temperature higher than or equal to 200° C. and lower than or equal to 700° C., so that the first oxide semiconductor film serves as a CAAC-OS film. Then, a second oxide semiconductor film is deposited over the first oxide semiconductor film using a crystal in the first oxide semiconductor film as a seed crystal, whereby a CAAC-OS film is obtained.

Note that since oxygen vacancy in the oxide semiconductor film 1020 is preferably reduced as much as possible, it is preferable that the oxide semiconductor film used for formation of the oxide semiconductor film 1020 be deposited with a deposition atmosphere in which an oxygen gas accounts for a large proportion; therefore, it can be said that it is preferable to use a sputtering apparatus into which oxygen can be introduced and in which the gas flow rate can be adjusted. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as closer to 100% as possible.

Further, when the oxide semiconductor film 1020 contains a large amount of hydrogen, the hydrogen and an oxide semiconductor are bonded to each other, so that part of the hydrogen serves as a donor and causes generation of an electron which is a carrier. As a result, the threshold voltage of a transistor shifts in the negative direction. Accordingly, the hydrogen concentration in the oxide semiconductor film 1020 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. Note that the concentration of hydrogen in the oxide semiconductor film 1020 is measured by secondary ion mass spectrometry (SIMS).

For the above-described reason, it is preferable that the gas used for deposition of the oxide semiconductor film 1020 does not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

Further, in deposition of the oxide semiconductor film 1020, in order to remove moisture (including water, water vapor, hydrogen, a hydroxyl group, or hydride) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film 1020 formed in the deposition chamber can be reduced.

Note that the oxide semiconductor film 1020 may have a structure in which a plurality of oxide semiconductor films are stacked. For example, the oxide semiconductor film 1020 may be a stack of the first oxide semiconductor film, the second oxide semiconductor film, and the third oxide semiconductor film, which each have a different composition. For example, the first oxide semiconductor film and the third oxide semiconductor film may be formed using a three-component metal oxide, and the second oxide semiconductor film may be formed using a two-component metal oxide.

Further, the constituent elements of the first oxide semiconductor film, the second oxide semiconductor film, and the third oxide semiconductor film may be the same and the composition ratios of the constituent elements of the first oxide semiconductor film, the second oxide semiconductor film, and the third oxide semiconductor film may be different. For example, the first oxide semiconductor film and the third oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may each have an atomic ratio of In:Ga:Zn=1:3:2, and the second oxide semiconductor film may have an atomic ratio of In:Ga:Zn=3:1:2.

At this time, the second oxide semiconductor film preferably contains more In than Ga. Further, the first oxide semiconductor film and the third oxide semiconductor film preferably contain In and Ga at a proportion of In ≤Ga.

In an oxide semiconductor, the s orbital of heavy metal mainly contributes to carrier transfer, and when the In content in the oxide semiconductor is increased, overlap of the s orbital increased is likely to be increased. Therefore, an oxide having a composition of In >Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In >Ga.

An oxide semiconductor having a composition of In >Ga is applied to the second oxide semiconductor film which is not contact with the insulating film 1019 or the gate insulating film 1024, and an oxide semiconductor having a composition of In≤Ga is applied to the first oxide semiconductor film or the third oxide semiconductor film which is contact with the insulating film 1019 or the gate insulating film 1024, whereby mobility and reliability of a transistor can be increased.

Note that when the film (the insulating film 1019, the gate insulating film 1024, or the like in the drawing) which is contact with and is different from the oxide semiconductor film is formed, an impurity might be diffused into the oxide semiconductor film from the film formed to be contact with the oxide semiconductor film. For example, when silicon, carbon, or the like contained in the insulating film 1019 or the gate insulating film 1024 is diffused into the oxide semiconductor film, electrical characteristics of the transistor may be adversely affected.

However, the oxide semiconductor film having higher mobility described above (that is, a portion mainly serving as a carrier path of the oxide semiconductor film) is provided away from the film (the insulating film 1019, the gate insulating film 1024, or the like in the drawing) which is contact with the oxide semiconductor film, whereby an adverse effect on electrical characteristics of the transistor due to impurity diffusion can be suppressed.

Note that after a film for forming the oxide semiconductor film 1020 is deposited or after the oxide semiconductor film 1020 is formed, "dehydration treatment (dehydrogenation treatment)" and "peroxide treatment" described below may be performed on the oxide semiconductor film. Needless to say, when the transistor using the oxide semiconductor film 1020 as the semiconductor layer has favorable electrical characteristics, the treatment is not necessarily performed.

<Description of Dehydration Treatment (Dehydrogenation Treatment)>

As dehydration treatment (dehydrogenation treatment), a substrate may be heated at a temperature of higher than or equal to 300° C. and lower than or equal to 700° C., or lower than the strain point of the substrate. The heat treatment is performed, whereby excess hydrogen (including water and a hydroxyl group) can be removed.

As a heat treatment apparatus, it is possible to use an electric furnace or an apparatus for heating an object to be processed using thermal conduction or thermal radiation generated from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA treatment may be performed as follows. An object to be processed is put in an inert gas atmosphere that has been heated, heated for several minutes, and taken out from the inert gas atmosphere. The GRTA process enables high-temperature heat treatment for a short time. Moreover, the GRTA treatment can be employed even when the temperature exceeds the upper temperature limit of the object to be processed. Note that the inert gas may be switched to a gas including oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is lower than or equal to 1 ppm, preferably less than or equal to 0.1 ppm).

<Description of Peroxide Treatment>

The dehydration or dehydrogenation treatment may accompany elimination of oxygen which is a main constituent material for an oxide semiconductor film to lead to a reduction in oxygen. Therefore, in the case where the dehydration or dehydrogenation treatment is performed, oxygen is preferably supplied to the oxide semiconductor film.

The oxygen vacancy in the oxide semiconductor film may be filled in the following manner for example: after the oxide semiconductor film is subjected to the dehydration treatment (the dehydrogenation treatment), a high-purity oxygen gas, a dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas that is introduced into the heat treatment apparatus is preferably greater than or equal to 6N, more preferably greater than or equal to 7N (i.e., the concentration of impurities in the oxygen gas or the dinitrogen monoxide gas is preferably less than or equal to 1 ppm, more preferably less than or equal to 0.1 ppm). Note that the pressure in the apparatus is set to be high in the heat treatment, whereby oxygen can be efficiently added to the oxide semiconductor film.

Alternatively, the oxygen vacancy in the oxide semiconductor film can be filled in the following manner for example: oxygen (including at least one of an oxygen radical, an oxygen atom, and an oxygen ion) is added to the oxide semiconductor film by an ion implantation method, an ion doping method, a plasma immersion ion implantation method, plasma treatment, or the like.

As described above, the deposited oxide semiconductor film is subjected to the dehydration treatment (the dehydrogenation treatment), whereby hydrogen or moisture is removed from the oxide semiconductor so that the oxide semiconductor is purified so as to contain impurities as little as possible. Then, oxygen that is a main component material of the oxide semiconductor, which is reduced through the dehydration treatment (the dehydrogenation treatment), is supplied (also referred to peroxide treatment), whereby the oxygen vacancy can be filled.

The conductive film 1022 may be formed of a film including an element selected from tantalum (Ta), tungsten (W), titanium (Ti), molybdenum (Mo), aluminum (Al), copper (Cu), chromium (Cr), and neodymium (Nd); or an alloy material or compound material mainly containing any of the elements by a physical vapor deposition (PVD) method such as a vacuum evaporation method or a sputtering method or a chemical vapor deposition (CVD) method such as a plasma CVD method. Further, for the conductive film, a semiconductor film typified by a polycrystalline silicon film doped with an impurity element such as phosphorus or an AgPdCu alloy film may be used.

Note that when a metal film (that is, the conductive film 1022) in contact with the oxide semiconductor film 1020 is formed using a metal with high oxygen affinity, oxygen is easily extracted from the oxide semiconductor film 1020; thus, the oxide semiconductor film 1020 may have a change in its composition.

Therefore, the conductive film 1022 in contact with the oxide semiconductor film 1020 is preferably formed using a metal with low oxygen affinity. For example, a tungsten film, a titanium film, or a molybdenum film can be used. In the case where the conductive film 1022 has a stacked-layer structure, for at least a layer of the conductive film 1022 in contact with the oxide semiconductor film 1020, a metal with low oxygen affinity is preferably used, and for the other layers, the above material, for example, a low-resistance conductive material such as aluminum or copper, is preferably used.

The gate insulating film 1024 may be formed using a method and a material similar to those of the insulating film 1019 and is preferably a film from which oxygen is released by heat treatment as well as the insulating film 1019.

The gate electrode 1026 may be formed using a method and a material similar to those of the conductive film 1022.

Note that at least a film of the gate electrode 1026 in contact with the gate insulating film 1024 is preferably a film of a material having a work function higher than that of a material of the oxide semiconductor film 1020. As the film, a metal oxide film containing nitrogen such as an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film or the like can be used. These films each have a work function higher than or equal to 5 eV (electron volts), preferably higher than or equal to 5.5 eV (electron volts); thus, when these are used for the gate electrode, the threshold voltage of the electrical characteristics of the transistor can be positive. Accordingly, what is called a normally-off switching element (in this embodiment, the first transistor 910 corresponds to the normally-off switching element) can be provided.

Note that as shown in FIG. 18A, a plurality of interlayer films (interlayer films 1010, 1014, and 1018 in the drawing) or a plurality of conductive films (conductive films 1012 and 1016 in the drawing) may be formed between the layer where the second transistor 912 is formed and the layer where the first transistor 910 is formed. The gate electrode 308 of the second transistor 912 and one of the source and the drain of the first transistor 910 are electrically connected to each other using the conductive films 1012 and 1016.

The interlayer film 1014, the interlayer film 1018, and the conductive film 1016 may be formed using a known method and a known material, which are generally used as an interlayer film or a conductive film. Note that the first transistor 910 is formed over the interlayer film 1018; therefore, it is preferable that the interlayer film 1018 be subjected to planarization treatment (e.g., CMP treatment) after the interlayer film 1018 is formed, whereby the planarity of the surface of the interlayer film 1018 is improved.

An OS transistor can be formed so that a plurality of layers or a plurality of conductive films is interposed between the OS transistor and another transistor; therefore, the degree of flexibility in the circuit configuration can be increased.

Further, as shown in FIG. 18A, a plurality of interlayer films (interlayer films 1028, 1032, 1036, and 1040 in the drawings) or a plurality of conductive films (conductive films 1030, 1034, and 1038 in the drawings) may be formed over the first transistor 910.

The interlayer films 1028, 1032, 1036, and 1040 and the conductive films 1030, 1034, and 1038 may be formed using a known method and a known material, which are generally used as an interlayer film or a conductive film.

The OS transistor can be formed using the plurality of layers or the plurality of conductive film as an upper layer as described above; therefore, the length in the thickness direction of a through wiring which is used for connection of the OS transistor and another transistor can be reduced. Also in terms of this point, it can be said that the degree of flexibility in the circuit configuration can be increased. Further, it can be said that the through wiring is easily formed.

Note that the first transistor 910 described above includes the conductive film 1022 serving as the source or the drain and the gate electrode 1026 over the oxide semiconductor film 1020, which is what is called a top-gate top-contact (TGTC) structure; however, the structure of the first transistor 910 is not limited to the structure.

For example, the first transistor 910 may have a top-gate bottom-contact (TGBC) structure in which the conductive film 1022 serving as the source or the drain is formed under the oxide semiconductor film 1020.

Figure 18B:
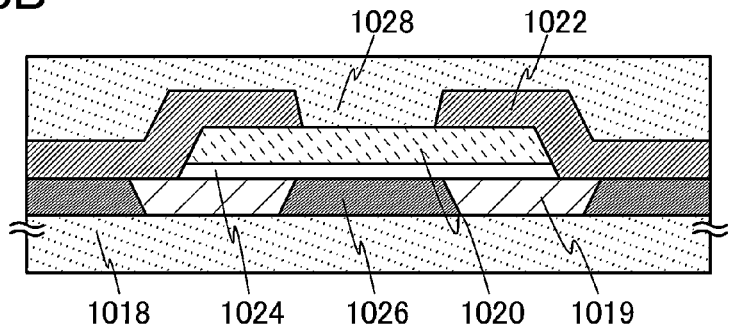

Further, as shown in FIG. 18B, the first transistor 910 may include the gate electrode 1026 under the oxide semiconductor film 1020 with the gate insulating film 1024 interposed therebetween, which is a bottom-gate top-contact (BGTC) structure. Further, the first transistor 910 may include the conductive film 1022 serving as the source or the drain under the oxide semiconductor film 1020 in FIG. 18B, which is a bottom-gate bottom-contact (BGBC) structure.

Figure 18C:
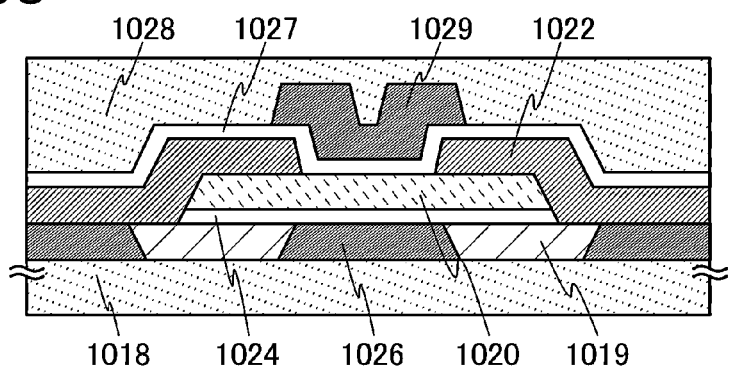

Furthermore, as shown in FIG. 18C, the first transistor 910 may include a back gate electrode 1029 over the oxide semiconductor film 1020 with an insulating film 1027 interposed therebetween. With the structure including the back gate electrode 1029, even when the first transistor 910 is in a normally-on state (here, the term "normally-on state" means that the transistor is turned on when power supply voltage is not supplied), power supply voltage is supplied to the back gate electrode 1029 as appropriate, whereby the threshold voltage of the first transistor 910 can be shifted to keep the first transistor 910 in a normally-off state (here, the term "normally-off state" means that the transistor is turned off when power supply voltage is not supplied).

EXAMPLE 1

In this example, an example of manufacturing an SOI substrate described in Embodiment 1 is specifically described, and conditions of the plasma treatment 108 which is performed after the ion addition treatment 104 or effects thereof (the effect of reducing Si—H bonds which have low contribution to separation of the semiconductor thin film layer 110, the effect of reducing P-V value of the surface of the SOI substrate, or the like) are specifically described.

(Manufacturing Method of Sample)

First, thermal oxidation treatment was performed on a single crystal silicon substrate with a size of 5 inches square so that an oxide film containing chlorine was formed on a surface of the single crystal silicon substrate. The thermal oxidation treatment was performed so that the thickness of the oxide film containing chlorine was 100 nm. Specifically, the thermal oxidation treatment was performed at 950° C. for 210 minutes in an oxidizing atmosphere in which hydrogen chloride (HCl) was contained by 3 volume % with respect to oxygen.

Next, the single crystal silicon substrate was irradiated with hydrogen ions through the oxide film by an ion doping apparatus, so that an embrittlement region is formed in the single crystal silicon substrate. Note that, a 100% hydrogen gas was used as the source gas, and the hydrogen gas was excited so as to generate plasma. The generated plasma includes three kinds of ion species ($H^+$, $H_2^+$, and $H_3^+$). These ion species were accelerated by an electric field without mass separation to irradiate the single crystal silicon substrate. Note that approximately 70% of the ion species that were generated from the hydrogen gas was $H_3^+$. The flow rate of the hydrogen gas was 50 sccm.

The ion irradiation was performed under the following conditions: the acceleration voltage of 50 kV, the current density of 6.35 μA/cm², and the total number (dose) of ions of $1.75 \times 10^{16}$ ions/cm². Note that as described in Embodiment 1, when the total dose of ions is added in one ion addition treatment, crystallinity of the single crystal silicon substrate is largely reduced due to an increase in the temperature of the single crystal silicon substrate and the crystallinity is not sufficiently repaired even if heat treatment is performed after this. Therefore, in this example, the dose in one ion addition treatment was as low as $2.5 \times 10^{15}$ ions/cm² and the ion addition treatment was performed seven times. Note that in this example, the ion addition treatment was performed seven times; however, there is no particular limitation on the number of times of the ion addition treatment as long as the substrate is kept at a temperature of lower than or equal to 200° C. in the ion addition treatment.

Figure 10:
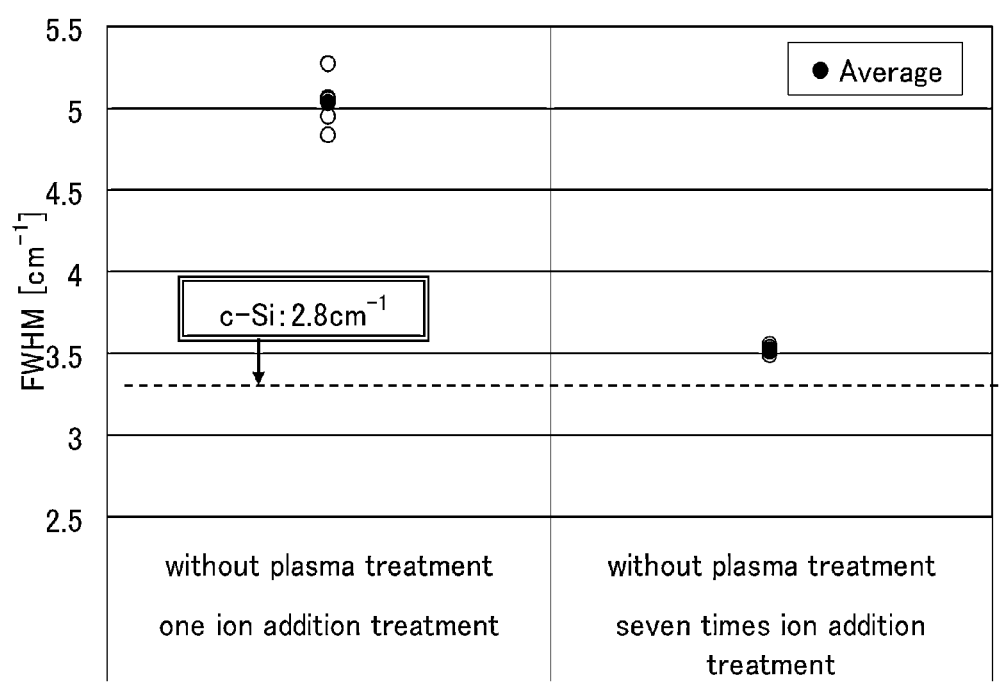
FIG. 10 illustrates crystallinity of a semiconductor thin film layer.

Here, an SOI substrate was manufactured using a single crystal silicon substrate in which an embrittlement region was formed in one ion addition treatment and an SOI substrate was manufactured using a single crystal silicon substrate in which an embrittlement region was formed in a plurality of ion implantation treatment (here, seven times). Then, Raman spectroscopy was performed on semiconductor thin film layers of the both substrates and the crystallinity was compared to each other by a full width at half maximum (FWHM, hereinafter also referred to simply as a half width) of Raman peak. FIG. 10 shows measurement results at 5 points on a surface of each substrate. In FIG. 10, the vertical axis is a half width of Raman peak. Note that the both substrates were not subjected to plasma treatment.

As in FIG. 10, it is confirmed that in the case of using the single crystal silicon substrate in which an embrittlement region is formed in a plurality of ion addition treatment (a group of plots on the right side in FIG. 10), in a silicon layer of the SOI substrate manufactured using the substrate, the crystallinity is repaired to a state close to the crystallinity of single crystal silicon (c-Si:2.8 cm⁻¹ in FIG. 10) by heat treatment at the time of the bonding or the like and thus the silicon layer has favorable crystallinity as compared to the case of using the single crystal silicon substrate in which an embrittlement region is formed in one ion addition treatment (a group of plots on the left side in FIG. 10).

Next, plasma treatment was performed on the surface of the single crystal silicon substrate, in which the embrittlement region was formed by a plasma treatment apparatus. Note that the plasma treatment was performed under the following same conditions: the temperature at a stage where the single crystal silicon substrate was provided was 300° C. and the pressure in treatment atmosphere was 500 Pa.

Then, a single crystal silicon substrate in which plasma treatment was performed in a mixed gas atmosphere containing hydrogen and argon under the following conditions: the substrate temperature of 300° C., power applied of 500 W, and the treatment time of 30 minutes, was referred to as Sample 1. Further, a single crystal silicon substrate which was heated in a nitrogen atmosphere of 300° C. for 30 minutes without performing plasma treatment in order to avoid an influence of the temperature (300° C.) at the stage at the time of plasma treatment was referred to as Sample 2. Further, in addition to these two samples, a single crystal silicon substrate which was not subjected to plasma treatment and heat treatment was referred to as Sample 3.

Figure 11:
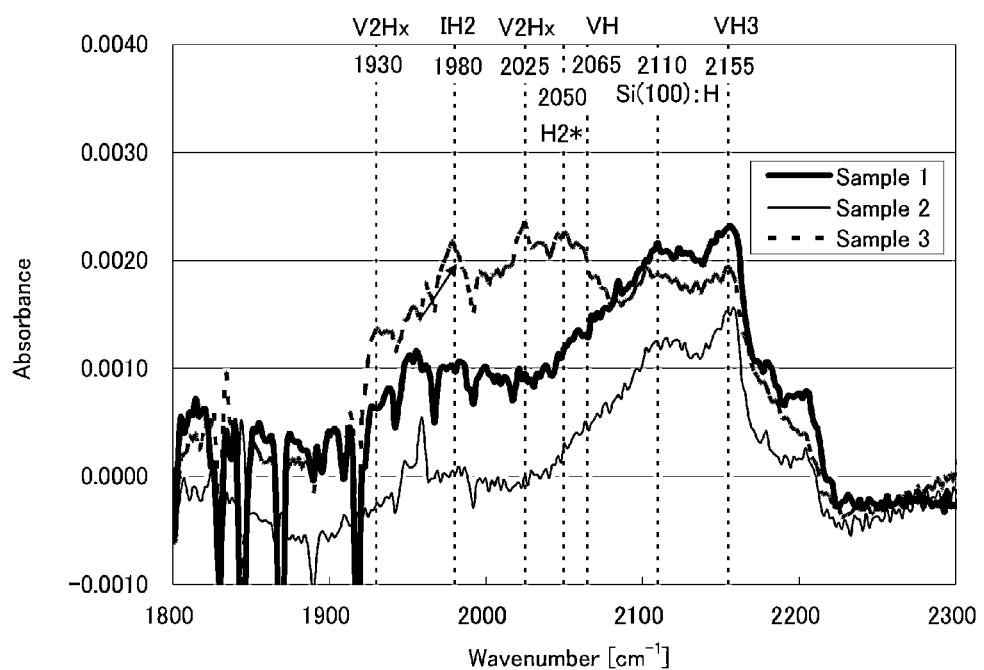
FIG. 11 illustrates a Si—H bonding state in a semiconductor substrate.

Next, evaluation of Si—H bonds in the vicinity of the embrittlement region of each sample (the samples 1 to 3) was performed using Fourier transform infrared spectroscopy (FT-IR). FIG. 11 shows the evaluation results. In FIG. 11, the vertical axis indicates absorbance (arbitrary unit) and the horizontal axis indicates a wavenumber ($cm^{-1}$).

Figure 9:
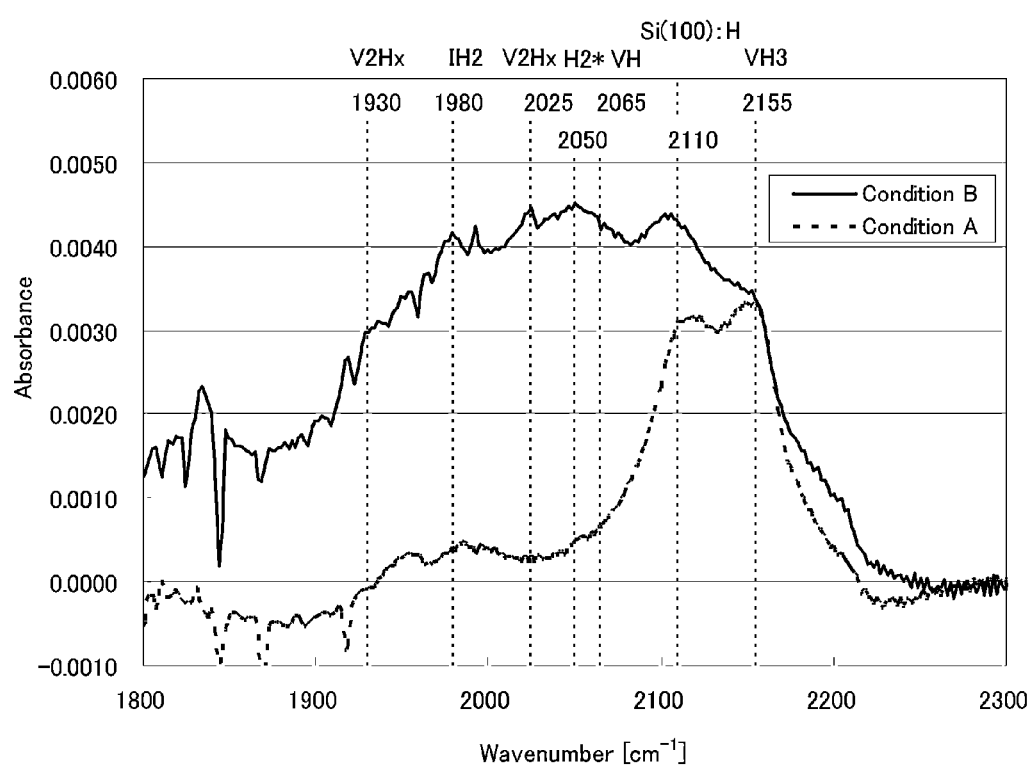
FIG. 9 illustrates a Si—H bonding state in a semiconductor substrate.

As in FIG. 11, in Sample 3 (the substrate which was not subjected to plasma treatment and heat treatment), as in Condition B of FIG. 9, in addition to peaks at 2100 $cm^{-1}$ and at 2155 $cm^{-1}$ due to Si—H bonds which have high contribution to separation of a silicon thin film layer, peaks due to a variety of Si—H bonds are confirmed in a range of greater than or equal to 1930 $cm^{-1}$ and less than or equal to 2065 $cm^{-1}$. Thus, it is expected that relatively large unevenness be formed on the surface of a silicon thin film layer of an SOI substrate manufactured using the substrate.

Further, in Sample 2 (the single crystal silicon substrate which was heated in a nitrogen atmosphere of 300° C. for 30 minutes without performing plasma treatment), it is confirmed that peaks in a range of greater than or equal to 1930 $cm^{-1}$ and less than or equal to 2065 $cm^{-1}$ due to Si—H bonds which have low contribution to separation of a silicon thin film layer are reduced; however, peaks at 2110 $cm^{-1}$ and at 2155 $cm^{-1}$ due to Si—H bonds which have high contribution to separation of a silicon thin film layer are also greatly reduced. Thus, it is expected that relatively large unevenness be also formed on the surface of the silicon thin film layer of an SOI substrate manufactured using the substrate.

However, in Sample 1 (the single crystal silicon substrate which was subjected to plasma treatment), it is confirmed that peaks in a range of greater than or equal to 1930 $cm^{-1}$ and less than or equal to 2065 $cm^{-1}$ due to Si—H bonds which have low contribution to separation of a silicon thin film layer are reduced while peaks at 2110 $cm^{-1}$ and at 2155 $cm^{-1}$ due to Si—H bonds which have high contribution to separation of a silicon thin film layer are kept as in Sample 3. Thus, it is indicated that there is a possibility that unevenness on the surface of a silicon thin film layer of an SOI substrate using the substrate is reduced.

Next, the surface of each sample, in which the embrittlement region was formed, was bonded to a base substrate. Further, the temperature was increased to 200° C. using a vertical heating furnace and heating was performed for 2 hours. Then, the temperature was increased to 600° C. and heating was performed for 2 hours. After that, the temperature was decreased and the single crystal silicon substrates were separated from the base substrates to manufacture three kinds of SOI substrates (hereinafter, the SOI substrate manufactured using Sample 1, the SOI substrate manufactured using Sample 2, and the SOI substrate manufactured using Sample 3 are referred to as Sample 1S, Sample 2S, and Sample 3S, respectively). Note that AN100 which is a glass substrate manufactured by Asahi Glass Co., Ltd. was used as the base substrate.

Here, in order to confirm an influence of plasma treatment on the crystallinity of the semiconductor thin film layer of the SOI substrate, the crystallinity of the silicon thin film layer of Sample 1S was measured by Raman spectroscopy and the measurement results were compared to the measurement results in FIG. 10 by Raman spectroscopy. Results thereof are shown in FIG. 12.

Figure 12:
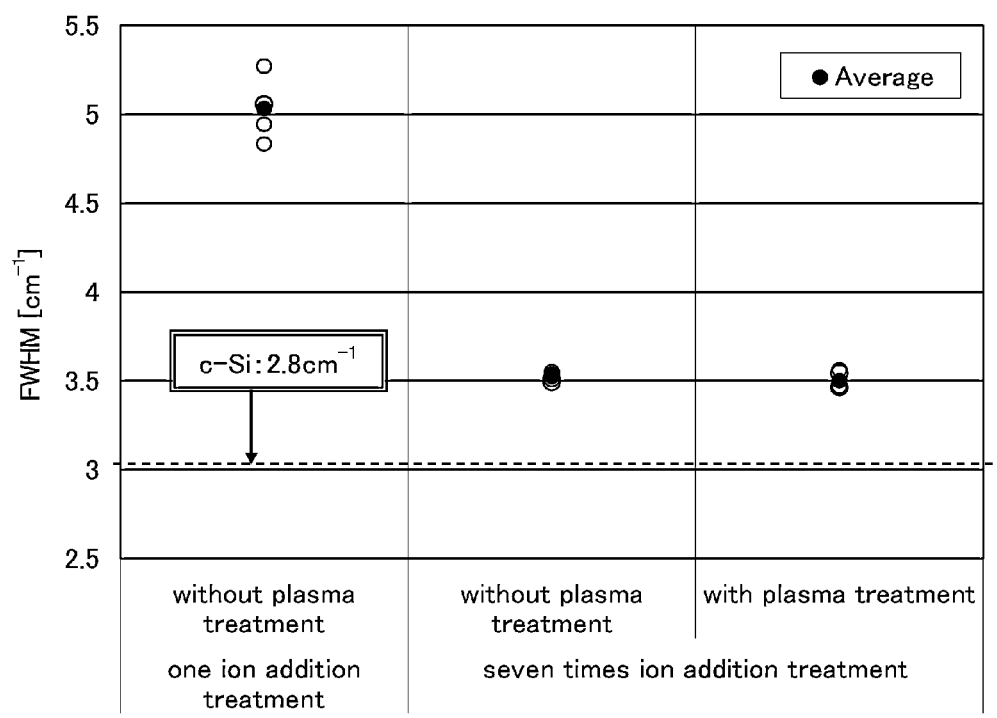
FIG. 12 illustrates surface conditions of a semiconductor thin film layer.

It is confirmed that an adversely effect is not given to the crystallinity of the semiconductor thin film layer even when the plasma treatment is performed for 30 minutes because there is not a particular difference in the half width between a group of plots on the center portion in FIG. 12 (without the plasma treatment) and a group of plots on the right side in FIG. 12 (with the plasma treatment: Sample 1S).

Figure 13:
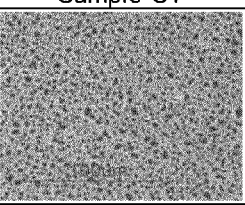
FIG. 13 illustrates crystallinity of a semiconductor thin film layer.

Next, dark-field images of the surfaces of the silicon thin film layers formed using Sample 1S to 3S were observed using an optical microscope. FIG. 13 shows the observation results. The observation magnification was 500 times. The observed regions of each sample were three portions of the substrate: the upper right portion, the central portion, and the bottom left portion.

As shown in FIG. 13, the surfaces of the silicon thin film layers formed using Sample 2S (without the plasma treatment and with the heat treatment in a nitrogen atmosphere of 300° C. for 30 minutes) and Sample 3S (without the plasma treatment and the heat treatment) have a similar uneven shape; however, it is found that the surface of the silicon thin film layer formed using Sample 1S (with the plasma treatment) is much finer than those of the silicon thin film layers formed using Sample 2S and Sample 3S.

Figure 14:
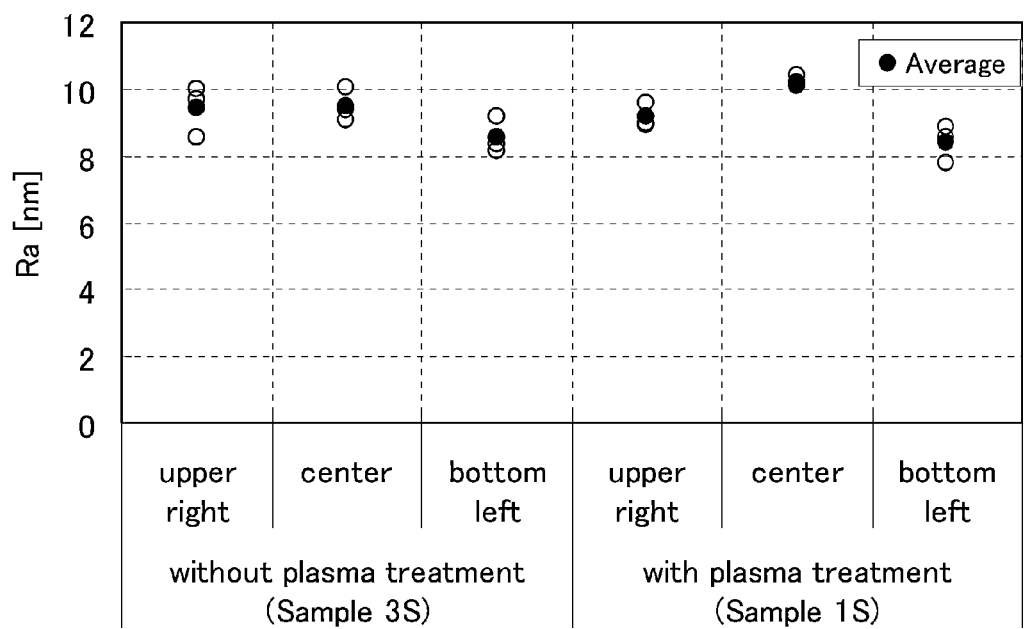
FIG. 14 illustrates surface conditions of a semiconductor thin film layer.
Figure 15:
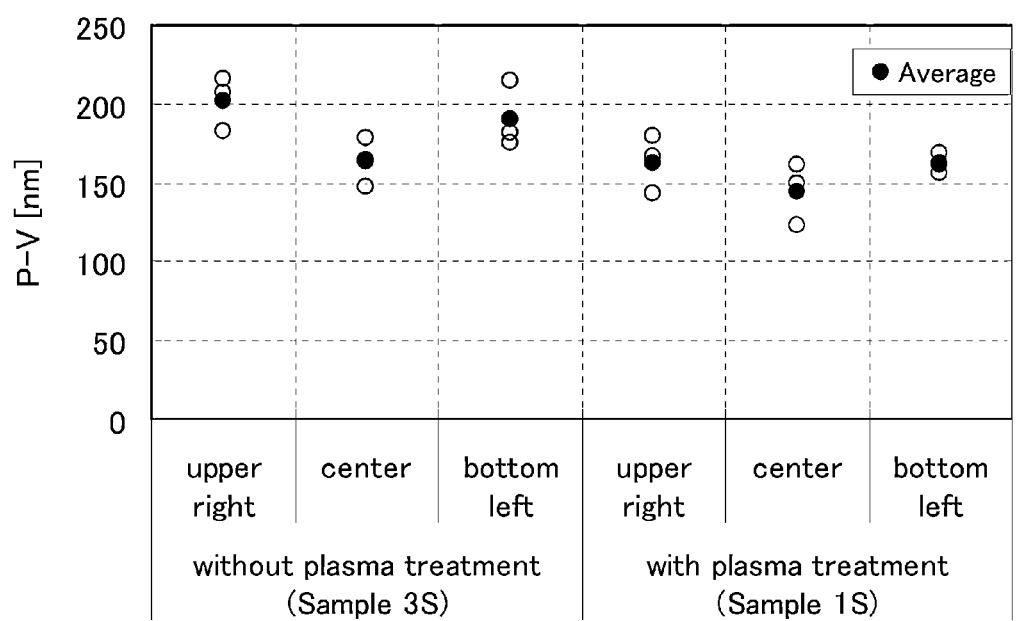
FIG. 15 illustrates surface conditions of a semiconductor thin film layer.

Next, the average surface roughness (Ra) and the maximum peak-to-valley height (P-V) of each of Sample 1S (with the plasma treatment) and Sample 3S (without the plasma treatment and the heat treatment) were measured using an atomic force microscope (AFM). FIG. 14 shows the measurement results of the average surface roughness (Ra) of each sample and FIG. 15 shows the measurement results of the maximum peak-to-valley height (P-V) of each sample. Note that the measurement points of each sample were three portions of the substrate: the upper right portion, the central portion, and the bottom left portion similarly to in the observation using the optical microscope, and each point was measured three times. The average surface roughness (Ra) is obtained by expanding arithmetic mean surface roughness Ra which is defined by JIS B 0601:2001 (ISO 4287:1997) into three dimensions so as to be able to apply Ra to a curved surface, and is an average value of the absolute values of deviations from a reference surface to a specific surface. The maximum peak-to-valley height (P-V) is a difference between the height of the highest peak and the height of the lowest valley in the specific surface. The peak and the valley refer to a peak and a valley obtained by expanding into three dimensions the "peak" and the "valley" which are defined by JISB0601:2001 (ISO 4287:1997). The peak refers to the highest point of the peaks in the specific surface. The valley refers to the lowest point of the valleys in the specific surface.

As shown in FIG. 14, a difference of the average surface roughness (Ra) between Sample 1S (with the plasma treatment) and Sample 3S (without the plasma treatment and the heat treatment) is less than or equal to 1 nm at an average value at all portions of the upper right portion, the central portion, and the bottom left portion. Accordingly, it is not confirmed that there is a particular difference in the average surface roughness (Ra) between Sample 1S and Sample 3S.

However, as shown in FIG. 15, it is confirmed that the maximum peak-to-valley height (P-V) of the surface of the silicon thin film layer formed using Sample 1S is approximately 20 nm to 40 nm smaller at an average value than that of the surface of the silicon thin film layer formed using Sample 3S.

Figure 16:
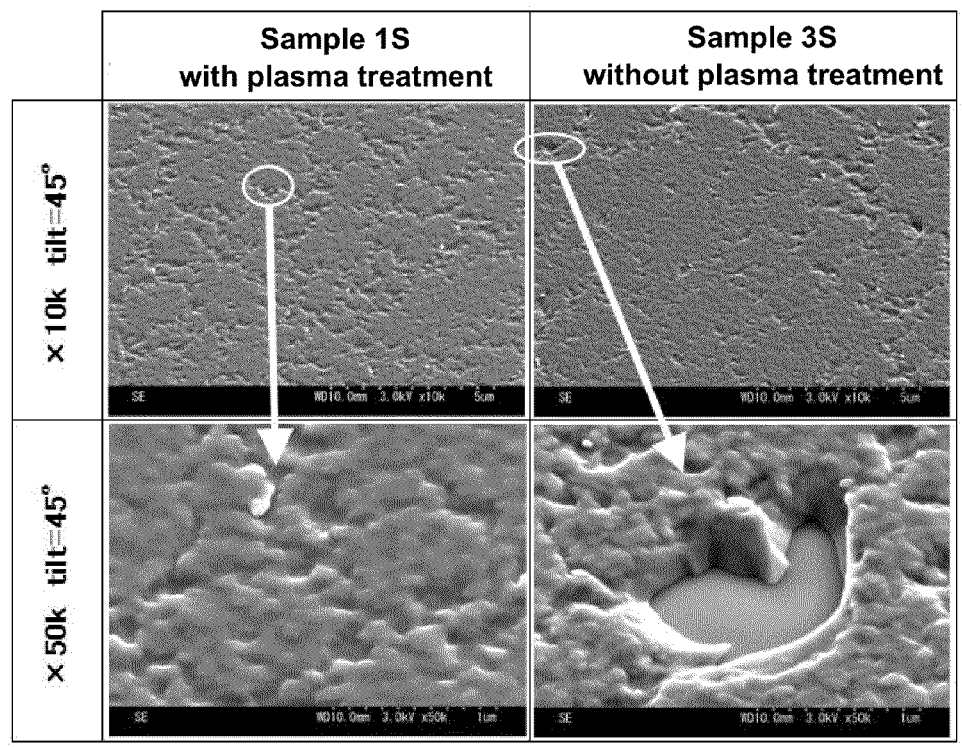
FIG. 16 illustrates surface conditions of a semiconductor thin film layer.

Note that in order to confirm the surface condition of the silicon thin film layer of each of Sample 1S (with the plasma treatment) and Sample 3S (without the plasma treatment and the heat treatment) in more detail, the surface was observed with a scanning electron microscope (SEM). FIG. 16 shows results thereof. As shown in FIG. 16, in Sample 3S (two photographs on the right side in FIG. 16), a large depressed portion is observed on part of the semiconductor thin film layer separated from the semiconductor substrate. This is a hole caused when the semiconductor thin film layer was not sufficiently separated from the semiconductor substrate due to a Si—H bond having a peak in a range of greater than or equal to 1930 $cm^{-1}$ and less than or equal to 2065 $cm^{-1}$, which has low contribution to separation of a silicon thin film layer, and thus the semiconductor thin film layer was not transferred over the base substrate. Such a large depressed portion caused an increase in the maximum peak-to-valley height (P-V) of Sample 3S.

According to the above results, the semiconductor substrate is kept at a low temperature (specifically, lower than or equal to 200° C.) in the ion addition treatment and is subjected to the plasma treatment while the semiconductor substrate is kept at a temperature of higher than or equal to 100° C. and lower than or equal to 400° C. after the ion addition treatment, whereby Si—H bonds which have low contribution to separation of the semiconductor thin film layer can be reduced while Si—H bonds which have high contribution to separation of the semiconductor thin film layer are kept. Further, an SOI substrate provided with the semiconductor thin film layer having small P-V and high crystallinity can be manufactured.

This application is based on Japanese Patent Application serial no. 2011-181744 filed with Japan Patent Office on Aug. 23, 2011, the entire contents of which are hereby incorporated by reference.

What is claimed is:

1. A method for manufacturing an SOI substrate, comprising the steps of:
   forming an insulating layer on a surface of a semiconductor substrate;
   forming an embrittlement region in the semiconductor substrate by adding accelerated ions to the semiconductor substrate;
   performing plasma treatment on the semiconductor substrate, whereby Si—H bonds are reduced;
   bonding a base substrate to the semiconductor substrate with the insulating layer interposed therebetween;
   performing heat treatment on the semiconductor substrate; and
   forming a semiconductor layer over the base substrate with the insulating layer interposed therebetween by separating the base substrate from the semiconductor substrate at the embrittlement region,
   wherein the semiconductor substrate is kept at a temperature of lower than or equal to 200° C. during the addition of the ions, and
   wherein the semiconductor substrate is kept at a temperature of higher than or equal to 100° C. during the plasma treatment.

2. The method for manufacturing an SOI substrate according to claim 1, wherein the ions are added to the semiconductor substrate plural times.

3. The method for manufacturing an SOI substrate according to claim 1, wherein the plasma treatment is performed for longer than or equal to 10 minutes.

4. The method for manufacturing an SOI substrate according to claim 1, wherein aluminosilicate glass, aluminoborosilicate glass, barium borosilicate glass, or quartz substrate is used for the base substrate.

5. The method for manufacturing an SOI substrate according to claim 1, wherein the Si—H bonds have low contribution to the step of separating the base substrate from the semiconductor substrate.

6. A method for manufacturing an SOI substrate, comprising the steps of:
   forming an insulating layer on a surface of a semiconductor substrate;
   forming an embrittlement region in the semiconductor substrate by adding accelerated ions to the semiconductor substrate;
   performing plasma treatment on the semiconductor substrate, whereby Si—H bonds are reduced;
   bonding a base substrate to the semiconductor substrate with the insulating layer interposed therebetween;
   performing heat treatment on the semiconductor substrate; and
   forming a semiconductor layer over the base substrate with the insulating layer interposed therebetween by separating the base substrate from the semiconductor substrate at the embrittlement region,
   wherein the semiconductor substrate is kept at a temperature of lower than or equal to 200° C. during the addition of the ions, and
   wherein the semiconductor substrate is kept at a temperature of higher than or equal to 100° C. and lower than or equal to 400° C. during the plasma treatment.

7. The method for manufacturing an SOI substrate according to claim 6, wherein the ions are added to the semiconductor substrate plural times.

8. The method for manufacturing an SOI substrate according to claim 6, wherein the plasma treatment is performed for longer than or equal to 10 minutes.

9. The method for manufacturing an SOI substrate according to claim 6, wherein aluminosilicate glass, aluminoborosilicate glass, barium borosilicate glass, or quartz substrate is used for the base substrate.

10. The method for manufacturing an SOI substrate according to claim 6, wherein the Si—H bonds have low contribution to the step of separating the base substrate from the semiconductor substrate.

11. A method for manufacturing an SOI substrate, comprising the steps of:
    forming an insulating layer on a surface of a semiconductor substrate;
    forming an embrittlement region in the semiconductor substrate by adding accelerated ions to the semiconductor substrate;
    performing plasma treatment on the semiconductor substrate, whereby Si—H bonds are reduced;

bonding a base substrate to the semiconductor substrate with the insulating layer interposed therebetween;

performing heat treatment on the semiconductor substrate; and forming a semiconductor layer over the base substrate with the insulating layer interposed therebetween by separating the base substrate from the semiconductor substrate at the embrittlement region, wherein the semiconductor substrate is kept at a temperature of lower than or equal to 200° C. during the addition of the ions, wherein the semiconductor substrate is kept at a temperature of higher than or equal to 100° C. and lower than or equal to 400° C. during the plasma treatment, and wherein the plasma treatment is performed so that when distribution of the Si—H bonds in the semiconductor substrate is measured by Fourier transform infrared spectroscopy, peaks of absorbance in a range greater than or equal to 1930 cm$^{-1}$ and less than or equal to 2065 cm$^{-1}$ in the semiconductor substrate after the plasma treatment are reduced from peaks of absorbance in the range in the semiconductor substrate before the plasma treatment.

12. The method for manufacturing an SOI substrate according to claim 11, wherein the ions are added to the semiconductor substrate plural times.

13. The method for manufacturing an SOI substrate according to claim 11, wherein the plasma treatment is performed for longer than or equal to 10 minutes.

14. The method for manufacturing an SOI substrate according to claim 11, wherein aluminosilicate glass, aluminoborosilicate glass, barium borosilicate glass, or quartz substrate is used for the base substrate.

15. The method for manufacturing an SOI substrate according to claim 11, wherein the Si—H bonds have low contribution to the step of separating the base substrate from the semiconductor substrate.

* * * * *